United States Patent
Nakamizo et al.

(10) Patent No.: US 8,422,622 B2
(45) Date of Patent: Apr. 16, 2013

(54) SHIFT REGISTER AND DISPLAY DEVICE

(75) Inventors: Masahiko Nakamizo, Osaka (JP); Masashi Yonemaru, Osaka (JP); Yasuaki Iwase, Osaka (JP); Kenichi Ishii, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/376,401

(22) PCT Filed: Feb. 24, 2010

(86) PCT No.: PCT/JP2010/001259
§ 371 (c)(1),
(2), (4) Date: Dec. 6, 2011

(87) PCT Pub. No.: WO2010/146743
PCT Pub. Date: Dec. 23, 2010

(65) Prior Publication Data
US 2012/0087459 A1    Apr. 12, 2012

(30) Foreign Application Priority Data

Jun. 15, 2009    (JP) .................................. 2009-142554

(51) Int. Cl.
*G11C 19/00*    (2006.01)
(52) U.S. Cl.
USPC .................................. 377/64; 377/69; 377/79
(58) Field of Classification Search .................... 377/64, 377/68, 69, 77–79
See application file for complete search history.

(56) References Cited

U.S. PATENT DOCUMENTS

| | | | |
|---|---|---|---|
| 5,646,642 | A | 7/1997 | Maekawa et al. |
| 5,748,026 | A | 5/1998 | Maekawa et al. |
| 6,426,743 | B1 | 7/2002 | Yeo et al. |
| 6,556,646 | B1 | 4/2003 | Yeo et al. |
| 6,788,108 | B2 | 9/2004 | Miyake et al. |
| 6,876,353 | B2 | 4/2005 | Morosawa et al. |
| 7,091,749 | B2 | 8/2006 | Miyake et al. |
| 7,362,139 | B2 | 4/2008 | Miyake et al. |
| 7,486,269 | B2 | 2/2009 | Moon |
| 7,724,232 | B2 | 5/2010 | Moon |
| 7,738,623 | B2 * | 6/2010 | Tobita ............................. 377/64 |
| 7,986,761 | B2 * | 7/2011 | Ieong et al. ..................... 377/64 |
| 8,107,586 | B2 * | 1/2012 | Shin et al. ....................... 377/64 |
| 8,320,516 | B2 * | 11/2012 | Toyotaka ......................... 377/64 |
| 2003/0002615 | A1 | 1/2003 | Morosawa et al. |
| 2003/0020520 | A1 | 1/2003 | Miyake et al. |
| 2003/0210220 | A1 | 11/2003 | Hebiguchi |
| 2004/0189584 | A1 | 9/2004 | Moon |
| 2005/0008114 | A1 | 1/2005 | Moon |
| 2005/0051802 | A1 | 3/2005 | Miyake et al. |

(Continued)

FOREIGN PATENT DOCUMENTS

| JP | 6216753 A | 8/1994 |
|---|---|---|
| JP | 2000155550 A | 6/2000 |

(Continued)

*Primary Examiner* — Tuan T Lam

(74) *Attorney, Agent, or Firm* — Harness, Dickey & Pierce, P.L.C.

(57) ABSTRACT

To provide a shift register and a display device each capable of satisfactorily preventing noises of individual stage outputs without increasing circuit complexity, each stage of the shift register includes: a first output transistor; a first capacitor; an input gate; a first switching element; a second switching element; a third switching element; a fourth switching element; and a fifth switching element.

2 Claims, 26 Drawing Sheets

U.S. PATENT DOCUMENTS

| | | |
|---|---|---|
| 2006/0132182 A1 | 6/2006 | Kikuchi |
| 2006/0290380 A1 | 12/2006 | Miyake et al. |
| 2009/0058790 A1* | 3/2009 | Chiang et al. ................. 345/100 |
| 2012/0044133 A1* | 2/2012 | Nakamizo et al. ............ 345/100 |
| 2012/0076256 A1* | 3/2012 | Yonemaru et al. .............. 377/79 |

FOREIGN PATENT DOCUMENTS

| | | |
|---|---|---|
| JP | 2003016794 A | 1/2003 |
| JP | 2003179479 A | 6/2003 |
| JP | 2003331594 A | 11/2003 |
| JP | 2003346492 A | 12/2003 |
| JP | 2004199066 A | 7/2004 |
| JP | 2005050502 A | 2/2005 |
| JP | 2006106320 A | 4/2006 |
| JP | 2006178165 A | 7/2006 |
| JP | 2008287134 A | 11/2008 |
| WO | WO-2010097986 A1 | 9/2010 |

* cited by examiner

FIG. 7
(a)
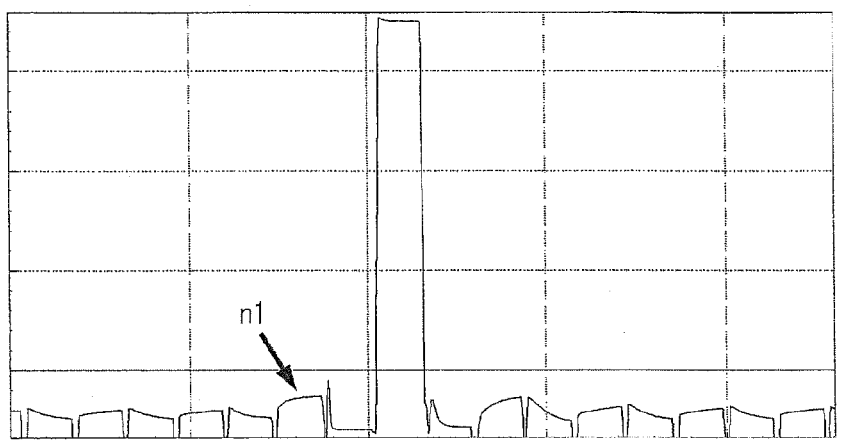
(b)
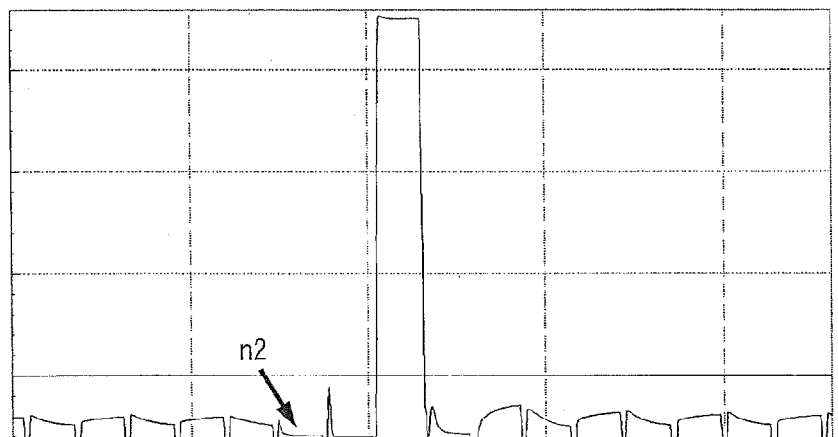

F I G. 8
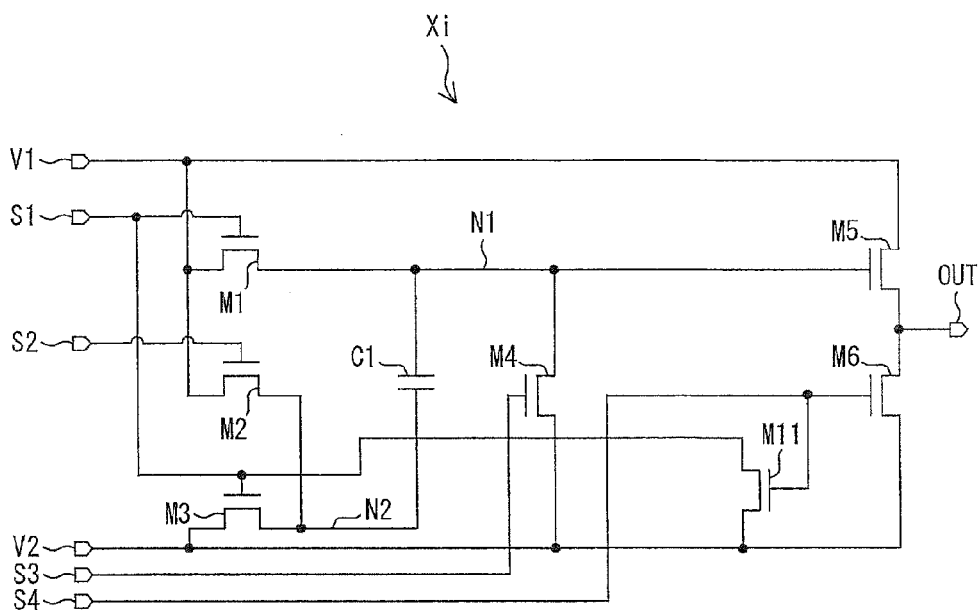

F I G. 1 1
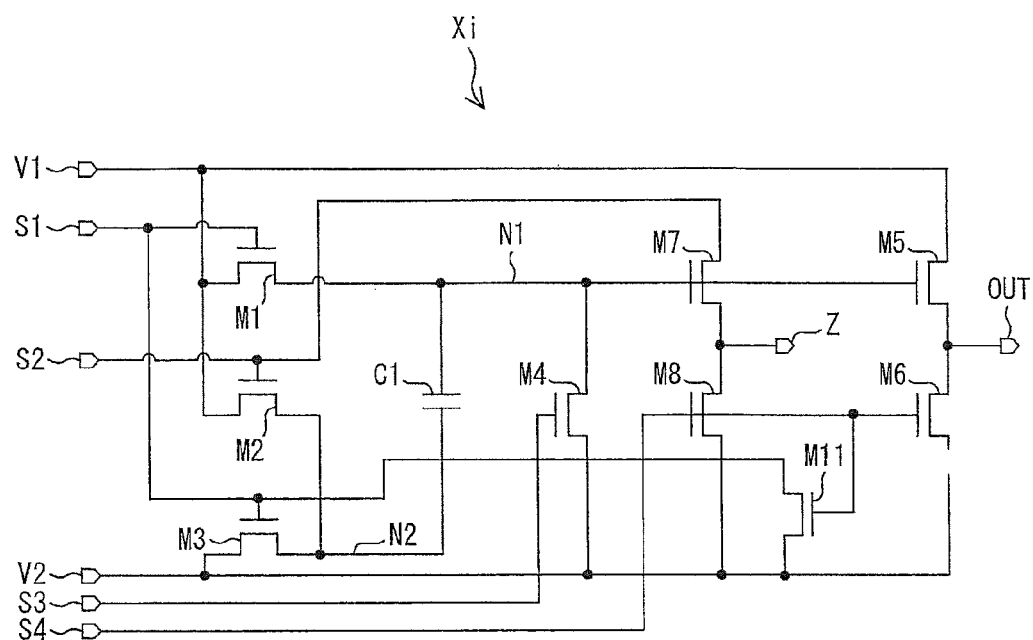

FIG. 14
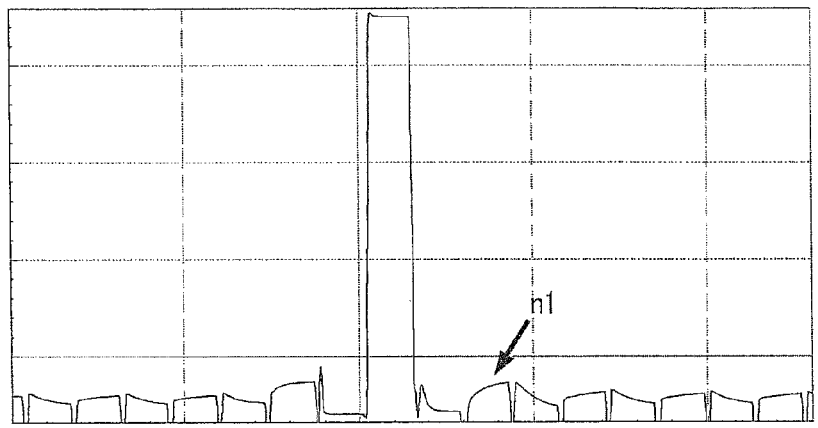
(a)
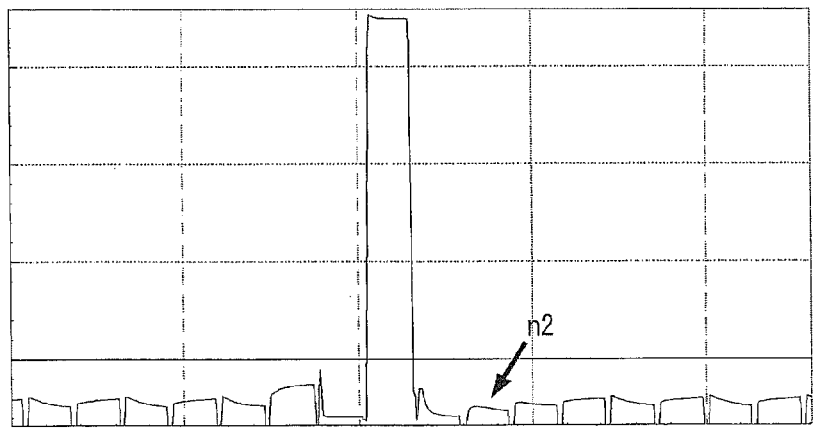
(b)

F I G . 1 5
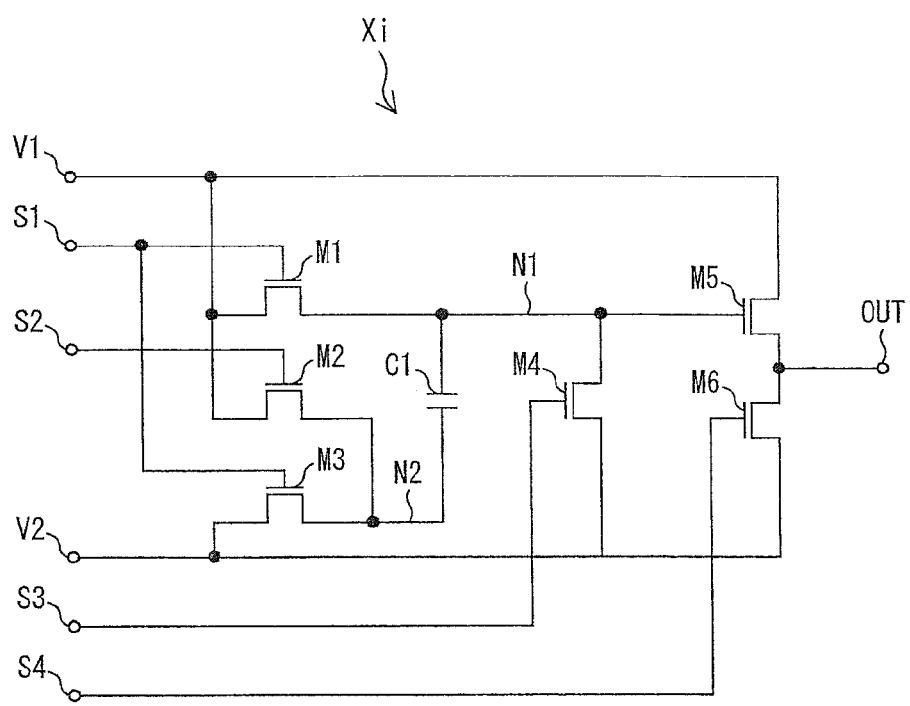

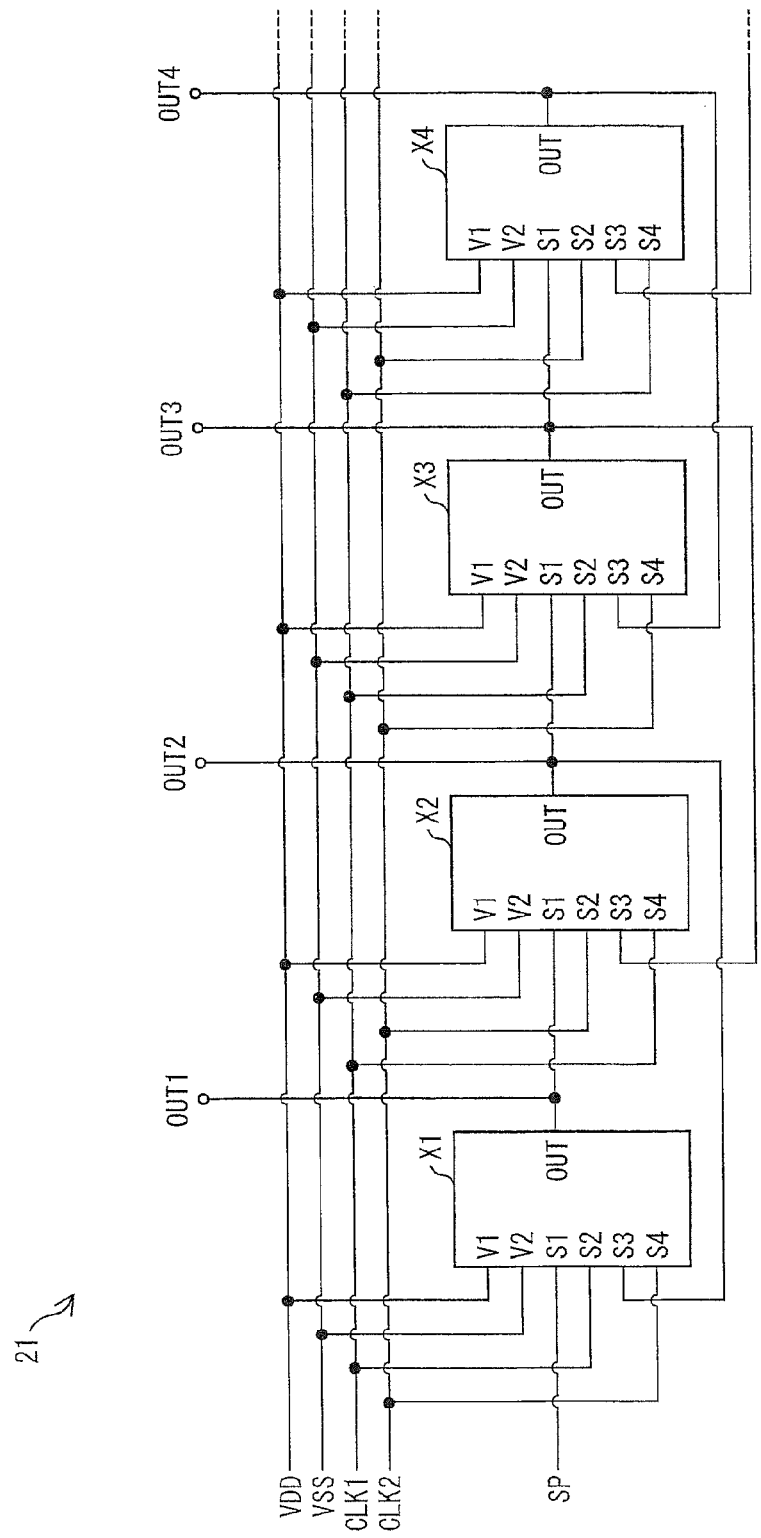
F I G . 1 6

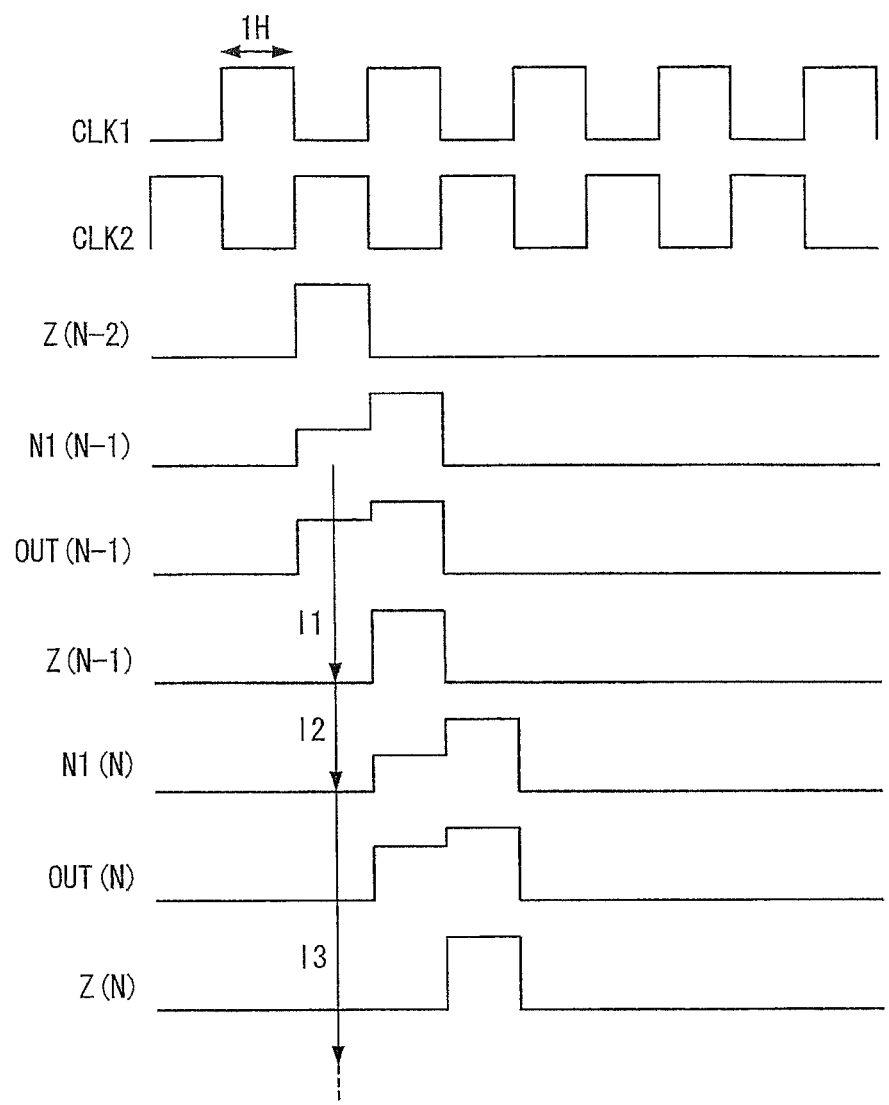
F I G. 2 0

F I G. 2 3
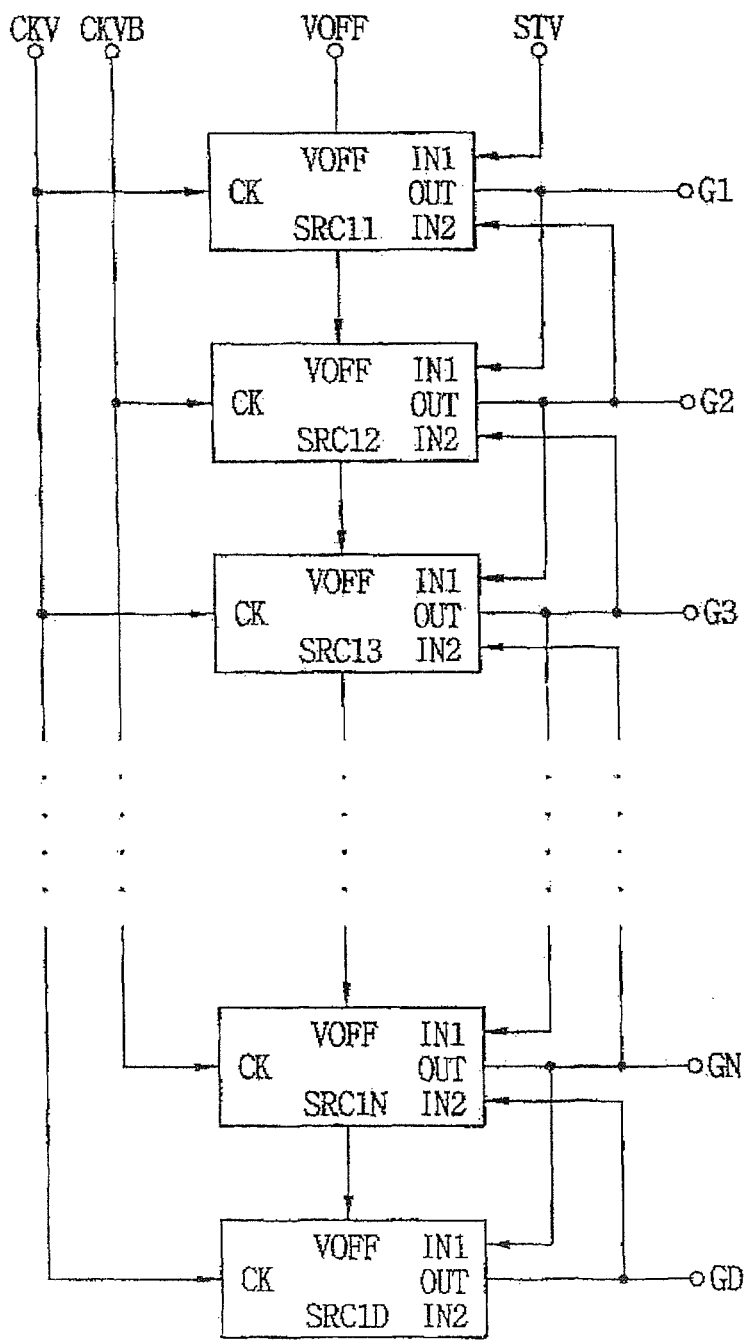

F I G. 2 6
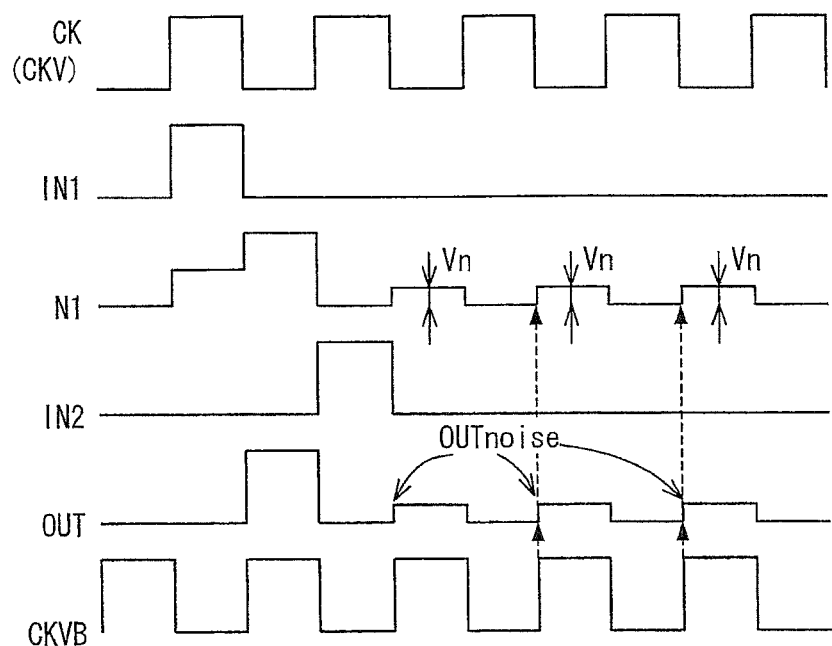

SHIFT REGISTER AND DISPLAY DEVICE

TECHNICAL FIELD

The present invention relates to a shift register for use in, for example, a gate driver of a display panel.

BACKGROUND ART

Recent years have witnessed development of gate monolithic configuration, in which a gate driver is formed of amorphous silicon on a liquid crystal panel for cost reduction. The term "gate monolithic configuration" is also referred to as, for example, "gate driver free", "built-in-panel gate driver", and "gate in panel."

FIG. 23 illustrates a configuration of such a gate driver (scan drive circuit) disclosed in Patent Literature 1.

This gate driver includes a plurality of unit stages SRC11, SRC12, ..., SRC1N, and SRC1D connected to one another in cascade. Each odd-numbered unit stage includes a clock terminal CK that is supplied with a first clock CKV, whereas each even-numbered unit stage includes a clock terminal CK that is supplied with a second clock CKVB. The first clock CKV is opposite in phase to the second clock CKVB. Each unit stage includes an output terminal OUT from which a gate signal (G1, G2, ..., GN, and GD) is supplied to a gate bus line.

The first unit stage SRC11 includes a first input terminal IN1 that is supplied with a scan start signal STV. The subsequent stages SRC12, SRC13, ..., SRC1N, and SRC1D each include a first input terminal IN1 that is supplied with a gate signal outputted from the immediately previous stage. The unit stages SRC11, SRC12, ..., and SRC1N each include a second input terminal IN2 that is supplied with a gate signal outputted from the next unit stage. Further, each unit stage includes a first voltage terminal VOFF.

Citation List
  Patent Literature 1
  Japanese Patent Application Publication, Tokukai, No. 2005-50502 A (Publication Date: Feb. 24, 2005)
  Patent Literature 2
  Japanese Patent Application Publication, Tokukai, No. 2000-155550 A (Publication Date: Jun. 6, 2000)
  Patent Literature 3
  Japanese Patent Application Publication, Tokukai, No. 2003-016794 A (Publication Date: Jan. 17, 2003)
  Patent Literature 4
  Japanese Patent Application Publication, Tokukaihei, No. 6-216753 A (Publication Date: Aug. 5, 1994)
  Patent Literature 5
  Japanese Patent Application Publication, Tokukai, No. 2003-346492 A (Publication Date: Dec. 5, 2003)

SUMMARY OF INVENTION

Technical Problem

Patent Literature 1 discloses a circuit configuration of a unit stage 100 illustrated in FIG. 24, the unit stage 100 serving as each of the unit stages SRC11, SRC12, ..., SRC1N, and SRC1D. The unit stage 100 includes: a buffer section 110; a charge section 120; a drive section 130; a discharge section 140; and a holding section 150.

The description below assumes, about an operation of this circuit, an example case in which the unit stage 100 is supplied with either a first clock CKV or a second clock CKVB set as in FIG. 25 by the applicant of the present application.

Specifically, if the unit stage 100 is an odd-numbered unit stage, the clock terminal CK thereof is supplied with the first clock CKV illustrated in FIG. 25, whereas if the unit stage 100 is an even-numbered unit stage, the clock terminal CK thereof is supplied with the second clock CKVB illustrated in FIG. 25. The first clock CKV is opposite in phase to the second clock CKVB.

The following describes an even-numbered unit stage 100 as an example.

As illustrated in FIG. 25, when a gate pulse is supplied from the immediately previous unit stage 100 to the first input terminal IN1, that is, a gate and a drain of a transistor Q1 in the buffer section 110, the transistor Q1 is set to the ON state, which charges a capacitor C in the charge section 120. This sets a transistor Q2 in the drive section 130 to the ON state. The gate pulse supplied from the immediately previous stage to the first input terminal IN1 then falls to a low level, and the transistor Q1 is thus set to the OFF state. After that, when the second clock CKVB at a high level is supplied to a drain of the transistor Q2, a bootstrap effect of the capacitor C raises the potential of a node N1 and sufficiently reduces the channel resistance of the transistor Q2, so that a gate pulse having an amplitude substantially equal to that of a clock signal is outputted from the output terminal OUT.

When the next unit stage 100 is supplied with this gate pulse and then outputs a gate pulse, this gate pulse is supplied to the second input terminal IN2 of the even-numbered unit stage 100. This sets a transistor Q3 in the drive section 130 and a transistor Q4 in the discharge section 140 to the ON state, and thus causes the output terminal OUT, the corresponding gate bus line, and the node N1 to be each connected to the first voltage terminal VOFF and consequently to be each reset to a low level.

While the other unit stages 100 operate, a transistor Q5 in the holding section 150 is set to the ON state each time the second clock CKVB supplied to the clock terminal CK rises to a high level. This periodically connects the node N1 to the output terminal OUT.

An odd-numbered unit stage 100 carries out the same operation with a timing shifted by one clock pulse from the timing illustrated in FIG. 25.

The above gate monolithic circuit configuration makes it possible to, even with use of only an n-channel TFT, sufficiently reduce the channel resistance of an output transistor such as the transistor Q2 by a bootstrap effect to improve drive performance. This achieves the advantage that even in the case where a gate driver is to be formed monolithically on a panel with use of a material, such as amorphous silicon, with which only an n-channel TFT can be produced easily, it is possible to (i) sufficiently overcome disadvantageous properties of an amorphous silicon TFT, such as a high threshold voltage and a low electron mobility, and thus to (ii) meet the demand for lowering a voltage for the panel.

The above conventional gate monolithic circuit, however, poses the problem that an output transistor such as the transistor Q2 in FIG. 24 has a gate-drain parasitic capacitor (hereinafter referred to as "drain parasitic capacitor") and a gate-source parasitic capacitor (hereinafter referred to as "source parasitic capacitor"). These distort a gate output waveform.

A clock voltage from the clock terminal CK is constantly applied to the drain of the transistor Q2. Thus, even while the transistor Q2 should be off, so-called feedthrough phenomenon causes a variation DN in the potential of the node N1 through the drain parasitic capacitor and thus causes leakage in the transistor Q2 each time the clock rises (see FIG. 25).

Such leakage in the transistor Q2 causes, as illustrated in FIG. 25, a leaked signal LO to be outputted from the output terminal OUT while a gate output should be set to the OFF state.

If the feedthrough phenomenon causes a variation DN in the potential of the node N1 through the drain parasitic capacitor such that the potential of the node N1 exceeds a threshold potential of the transistor Q2, the transistor Q2 is set to the ON state. This causes a clock to be leaked and outputted to the source of the transistor Q2, and this source output raises the potential of the node N1 through the capacitor C, so that, as illustrated in FIG. 26, (i) the potential of the node N1 is higher by Vn during a clock pulse period and (ii) the output terminal OUT is supplied with a pulse OUTnoise that rises with a pulse width equal to the clock pulse period.

While the output terminal OUT should be supplied with a gate pulse, the variation DN in the potential of the node N1 through the drain parasitic capacitor reduces the channel resistance of the transistor Q2 and increases a current, thereby improving drive performance of the transistor Q2. The output terminal OUT is, however, normally supplied with a gate pulse only once within one frame. The variation DN in the potential of the node N1 outside the gate pulse output period is a noise. For example, in a panel with resolution of WXGA, which panel includes 768 gate bus lines, a rise in the potential of a node N1 is a noise during (i) a period for 767 clocks outside a period during which each stage supplies its intended gate pulse to its corresponding gate bus line and (ii) a vertical blanking period set to separate frames each defined by a vertical synchronizing signal Vsync.

The source parasitic capacitor raises the potential of the node N1 while the gate pulse is outputted, and thus improves drive performance of the transistor Q2. This effect can be achieved to an extent even with use of only the source parasitic capacitor. A bootstrap capacitor indicated by the capacitor C in the transistor Q2 of FIG. 24 actively increases such an effect by providing a capacitor in parallel to the source parasitic capacitor. This method, however, does not achieve the bootstrap effect until the potential of the output terminal OUT has fully risen, and thus disadvantageously delays a rise TR of the gate pulse. Such a delay in the rise TR causes a waveform distortion in the gate pulse.

The stage configuration of FIG. 24, as described above, poses the problem of a noise caused in a stage output. Since each stage output is inputted to the next stage, such a noise is transmitted from one stage to the next, and may cause the shift register to malfunction.

This problem may be dealt with by a stage configuration that aims to prevent accumulation and transmission of a noise in a stage output with use of additional circuits. Such a stage configuration is, for example, another stage configuration of Patent Literature 1 (see FIG. 27).

The stage configuration of FIG. 27 includes transistors Q45 and Q46. This arrangement allows the output terminal OUT and the corresponding gate bus line to be connected to the first voltage terminal VOFF each time the clock rises outside the gate pulse output period, and thus allows the output terminal OUT and the gate bus line to be each maintained at a low level. This stage configuration includes a control circuit that is made up of transistors Q31 through Q34 and that causes the transistor Q45 to function. Further, in order for the output terminal OUT and the gate bus line to be each connected to the first voltage terminal VOFF for a longer period, the unit stage 400 includes two clock terminals, namely a first clock terminal CK1 and a second clock terminal CK2, which are supplied with respective clocks opposite to each other in phase, so that the transistors Q45 and Q46 are set to the ON state alternately.

The configuration of FIG. 27, however, requires the above additional circuits, and thus undesirably leads to an increase in the number of elements in a circuit and in the area of a circuit.

The present invention has been accomplished in view of the above problems with conventional art. It is an object of the present invention to provide a shift register and a display device each capable of satisfactorily preventing noises in individual stage outputs without increasing circuit complexity.

Solution to Problem

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a first capacitor having a first end connected to a gate of the first output transistor; an input gate which is supplied with a shift pulse for the each stage and which passes an electric potential to be supplied to the first end of the first capacitor during a pulse period of the shift pulse for the each stage; a first switching element having (i) a first end connected to a second end of the first capacitor, (ii) a second end to which the first direct current voltage is applied, and (iii) a conduction-and-shutoff control terminal that is supplied with a first clock signal which corresponds to the each stage and which has an active clock pulse during a period that does not overlap the pulse period of the shift pulse for the each stage; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the first output terminal of the each stage; and a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the first output terminal of a next stage and (B) in a case where the each stage is the final stage of the successive stage group, a pulse signal that is delayed in phase from a shift pulse outputted from the first output terminal of the final stage, at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with the shift pulse for the each stage.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor.

Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

The fifth switching element achieves the following: When each stage is supplied, from the immediately previous stage, with a voltage at an active level or at a level close to the active level, the fifth switching element is set to the ON state, which causes the second direct current voltage to be applied to the first output terminal of the next stage. This arrangement reliably maintains the first output terminal at a low level while no voltage at the active level is outputted from the first output terminal of the stage.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the fifth switching element, which is connected to (i) the first output terminal of the immediately previous stage and (ii) the first output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a second output transistor having (i) a drain which is supplied with a first clock signal which corresponds to the each stage and which has an active clock pulse during a period that does not overlap a pulse period of a shift pulse for the each stage and (ii) a source serving as a second output terminal which is an output terminal of the each stage and which is different from the first output terminal; a first capacitor having a first end connected to a gate of the first output transistor and to a gate of the second output transistor; an input gate which is supplied with the shift pulse for the each stage and which passes an electric potential to be supplied to the first end of the first capacitor during the pulse period of the shift pulse for the each stage; a first switching element having (i) a first end connected to a second end of the first capacitor, (ii) a second end to which the first direct current voltage is applied, and (iii) a conduction-and-shutoff control terminal which is supplied with the first clock signal; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the second output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the second output terminal of a next stage and (B) in a case where the each stage is the final stage of the successive stage group, a pulse signal that is delayed in phase from a shift pulse outputted from the second output terminal of the final stage; and a sixth switching element having (i) a first end connected to the second output terminal, (ii) a second end to which the second direct current voltage is applied, and (iii) a conduction-and-shutoff control terminal connected to the conduction-and-shutoff control terminal of the fourth switching element, at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with the shift pulse for the each stage.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

Further, it is possible to prevent the potential of one end of the first capacitor from rising due to capacitive coupling, and thus prevent an output from the second output terminal from rising during an unnecessary period, thereby preventing the shift register from malfunctioning. In addition, it is possible to reduce the number of required input signals externally supplied to the shift register.

Further, since the second output transistor is used for outputting a shift pulse transmitted from one stage to another, the second output transistor can be greatly downsized as compared to the first output transistor used for supplying a signal to the outside of the shift register. Consequently, the drain parasitic capacitor of the second output transistor is sufficiently smaller than (i) the drain parasitic capacitor and the source parasitic capacitor of the first output transistor and (ii) the first capacitor. Therefore, even when the first clock signal is supplied to the drain of the second output transistor, it is possible to reduce, to an ignorable level, the influence of a rise in the potential of one end of the first capacitor due to capacitive coupling.

Further, a load caused by driving the second output terminal is sufficiently smaller than a load caused by driving the first output terminal. Therefore, the amount of a variation in the load on an external level shifter that generates a control signal for the shift register can be reduced to an ignorable level.

The fifth switching element achieves the following: When each stage is supplied, from the immediately previous stage, with a voltage at an active level or at a level close to the active level, the fifth switching element is set to the ON state, which causes the second direct current voltage to be applied to the second output terminal of the next stage. This arrangement reliably maintains the first output terminal at a low level while no voltage at the active level is outputted from the second output terminal of the stage.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the fifth switching element, which is connected to (i) the second output terminal of the immediately previous stage and (ii) the second output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a first capacitor having a first end connected to a gate of the first output transistor; an input gate which is supplied with a shift pulse for the each stage and which passes an electric potential to be supplied to the first end of the first capacitor during a pulse period of the shift pulse for the each stage; a first switching element having (i) a first end connected to a second end of the first capacitor, (ii) a second end to which the first direct current voltage is applied, and (iii) a conduction-and-shutoff control terminal that is supplied with a first clock signal which corresponds to the each stage and which has an active clock pulse during a period that does not overlap the pulse period of the shift pulse for the each stage; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the first output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the first output terminal of a next stage and (B) in a case where the each stage is the final stage of the successive stage group, a pulse signal that is delayed in phase from a shift pulse outputted from the first output terminal of the final stage; and a seventh switching element having a first end which is supplied with the shift pulse for the each stage, (ii) a second end to which the second direct current voltage is applied, and (iii) a conduction-and-shutoff control terminal connected to the conduction-and-shutoff control terminal of the fourth switching element.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

The seventh switching element achieves the following: When a signal supplied to the conduction-and-shutoff control terminal of the fourth switching element is set at an active level, the seventh switching element is set to the ON state, which causes the second direct current voltage to be applied to the first output terminal of the immediately previous stage. This arrangement prevents the first capacitor from (i) being unnecessarily charged due to a leak current via the input gate after the first end of the first capacitor of the stage is reset, and from (ii) being subjected to an unnecessary potential rise, which causes an interference, through an unnecessary electric charge of the first capacitor when the first switching element is set to the ON state.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the seventh switching element, which is connected to (i) the first output terminal of the immediately previous stage and (ii) the first output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a second output transistor having (i) a drain which is supplied with a first clock signal which corresponds to the each stage and which has an active clock pulse during a period that does not overlap a pulse period of a shift pulse for the each stage and (ii) a source serving as a second output terminal which is an output terminal of the each stage and which is different from the first output terminal; a first capacitor having a first end connected to a gate of the first output transistor and to a gate of the second output transistor; an input gate which is supplied with the shift pulse for the each stage and which passes an electric potential to be supplied to the first end of the first capacitor during the pulse period of the shift pulse for the each stage; a first switching element having (i) a first end connected to a second end of the first capacitor, (ii) a second end to which the first direct current voltage is applied, and (iii) a conduction-and-shutoff control terminal which is supplied with the first clock signal; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the second output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the second output terminal of a next stage and (B) in a case where the each stage is the final stage of the successive stage group, a pulse signal that is delayed in phase from a shift pulse outputted from the second output terminal of the final stage; a sixth switching element having (i) a first end connected to the second output terminal, (ii) a second end to which the second direct current voltage is applied, and (iii) a conduction-and-shutoff control terminal connected to the conduction-and-shutoff control terminal of the fourth switching element; and a seventh switching element having a first end which is supplied with the shift pulse for the each stage, (ii) a second end to which the second direct current voltage is applied, and (iii) a conduction-and-shutoff control terminal connected to the conduction-and-shutoff control terminal of the fourth switching element.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

Further, it is possible to prevent the potential of one end of the first capacitor from rising due to capacitive coupling, and thus prevent an output from the second output terminal from rising during an unnecessary period, thereby preventing the shift register from malfunctioning. In addition, it is possible to reduce the number of required input signals externally supplied to the shift register.

Further, since the second output transistor is used for outputting a shift pulse transmitted from one stage to another, the second output transistor can be greatly downsized as compared to the first output transistor used for supplying a signal to the outside of the shift register. Consequently, the drain parasitic capacitor of the second output transistor is sufficiently smaller than (i) the drain parasitic capacitor and the source parasitic capacitor of the first output transistor and (ii) the first capacitor. Therefore, even when the first clock signal is supplied to the drain of the second output transistor, it is possible to reduce, to an ignorable level, the influence of a rise in the potential of one end of the first capacitor due to capacitive coupling.

Further, a load caused by driving the second output terminal is sufficiently smaller than a load caused by driving the first output terminal. Therefore, the amount of a variation in the load on an external level shifter that generates a control signal for the shift register can be reduced to an ignorable level.

The seventh switching element achieves the following: When a signal supplied to the conduction-and-shutoff control terminal of each of the fourth and sixth switching elements is set at an active level, the seventh switching element is set to the ON state, which causes the second direct current voltage to be applied to the second output terminal of the immediately previous stage. This arrangement prevents the first capacitor from (i) being unnecessarily charged due to a leak current via the input gate after the first end of the first capacitor of the stage is reset, and from (ii) being subjected to an unnecessary potential rise, which causes an interference, through an unnecessary electric charge of the first capacitor when the first switching element is set to the ON state.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the seventh switching element, which is connected to (i) the second output terminal of the immediately previous stage and (ii) the second output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

Advantageous Effects of Invention

As described above, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a first capacitor having a first end connected to a gate of the first output transistor; an input gate which is supplied with a shift pulse for the each stage and which passes an electric potential to be supplied to the first end of the first capacitor during a pulse period of the shift pulse for the each stage; a first switching element having (i) a first end connected to a second end of the first capacitor, (ii) a second end to which the first direct current voltage is applied, and (iii) a conduction-and-shutoff control terminal that is supplied with a first clock signal which corresponds to the each stage and which has an active clock pulse during a period that does not overlap the pulse period of the shift pulse for the each stage; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the first output terminal of the each stage; and a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the first output terminal of a next stage and (B) in a case where the each stage is the final stage of the successive stage group, a pulse signal that is delayed in phase from a shift pulse outputted from the first output terminal of the final stage, at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with the shift pulse for the each stage.

The above arrangement makes it possible to provide a shift register capable of satisfactorily preventing noises of individual stage outputs without increasing circuit complexity.

The above arrangement further prevents an unnecessary output from being transmitted to a later stage.

BRIEF DESCRIPTION OF DRAWINGS

FIG. 7 illustrates waveform charts each illustrating output waveforms of a stage, where (a) is a waveform chart illustrating an output waveform of a stage including no fifth switching element, and (b) is a waveform chart illustrating an output waveform of a stage including a fifth switching element.

FIG. 8 is a circuit diagram illustrating a configuration of a stage included in a shift register of a third embodiment of the present invention.

FIG. 11 is a circuit diagram illustrating a configuration of a stage included in a shift register of a fourth embodiment of the present invention.

FIG. 14 illustrates waveform charts of an embodiment of the present invention each illustrating output waveforms of a stage, where (a) is a waveform chart illustrating an output waveform of a stage including no seventh switching element, and (b) is a waveform chart illustrating an output waveform of a stage including a seventh switching element.

FIG. 15 is a circuit diagram illustrating a first basic configuration of a stage included in a shift register of an embodiment of the present invention.

FIG. 16 is a block diagram illustrating a configuration of a shift register including a stage having the first basic configuration.

FIG. 20 is a waveform chart illustrating an operation of the shift register including a stage having the second basic configuration.

FIG. 23 is a block diagram illustrating a configuration of a shift register of conventional art.

FIG. 26 is a second waveform chart illustrating a problem with a conventional shift register.

DESCRIPTION OF EMBODIMENTS

Embodiments of the present invention are described below with reference to FIGS. 1 through 22.

Figure 21:
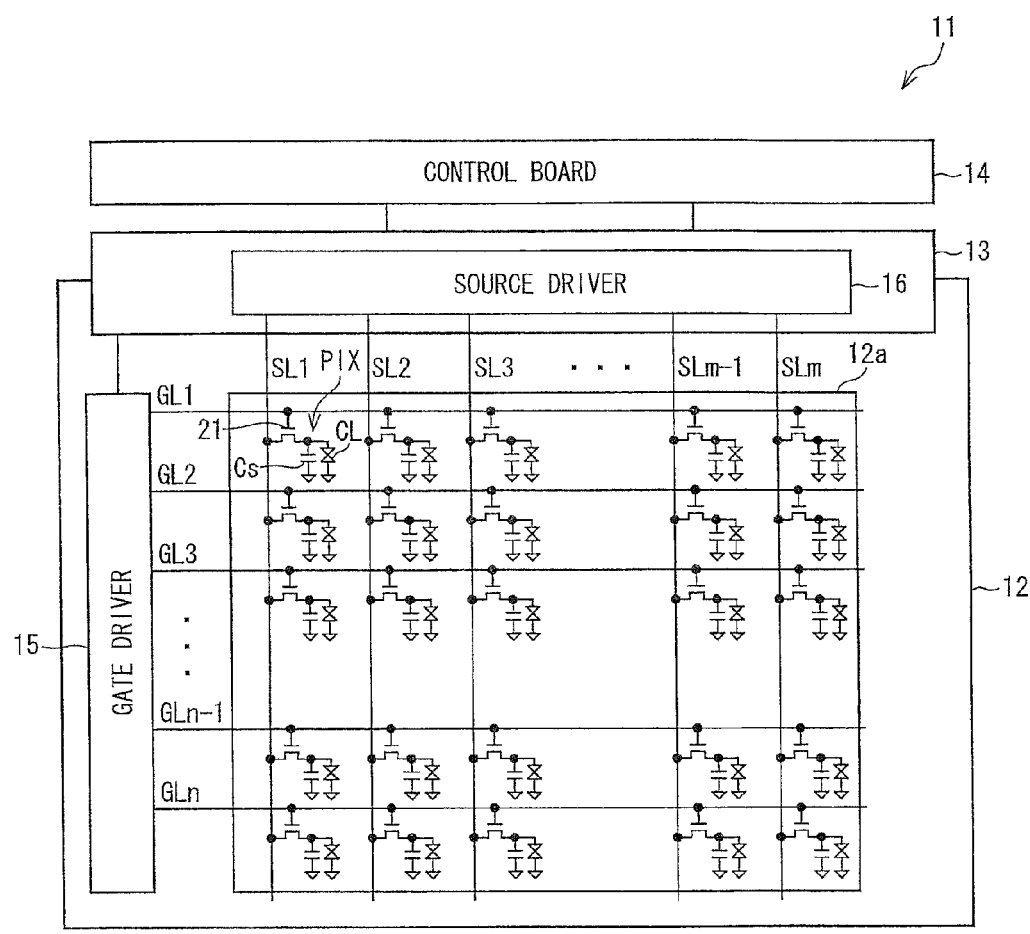
FIG. 21 is a block diagram illustrating a configuration of a display device of an embodiment of the present invention.

FIG. 21 illustrates a configuration of a liquid crystal display device 11, which is a display device of the present embodiment.

The liquid crystal display device 11 includes: a display panel 12; a flexible printed circuit board 13; and a control board 14.

The display panel 12 is an active matrix display panel that includes, on a glass substrate: a display region 12a; a plurality of gate bus lines (scanning signal lines) GL . . . ; a plurality of source bus lines (data signal lines) SL . . . ; and a gate driver (scanning signal line driving circuit) 15, each made of amorphous silicon. The display panel 12 may alternatively be made of, for example, polycrystalline silicon, CG silicon, or microcrystalline silicon. The display region 12a is a region in which a plurality of picture elements PIX . . . are arranged in a matrix. The picture elements PIX each include: a TFT 21 serving as a selection element for the picture element; a liquid crystal capacitor CL; and an auxiliary capacitor Cs. The TFT 21 has (i) a gate connected to its corresponding gate bus line GL and (ii) a source connected to its corresponding source bus line SL. The liquid crystal capacitor CL and the auxiliary capacitor Cs are connected to a drain of the TFT 21.

The plurality of gate bus lines GL . . . include gate bus lines GL1, GL2, GL3, . . . , and GLn, each of which is connected to an output of the gate driver (scanning signal line driving circuit) 15. The plurality of source bus lines SL . . . include source bus lines SL1, SL2, SL3, . . . , and SLm, each of which is connected to an output of a source driver 16 described below. The display panel 12 further includes auxiliary capacitor lines (not shown) each for applying an auxiliary capacitor voltage to the auxiliary capacitor Cs of each corresponding picture element PIX.

The gate driver 15 is provided in a first region on the display panel 12, the first region being located to be adjacent to the display region 12a on a first side of the direction in which the gate bus lines GL . . . extend. The gate driver 15 sequentially supplies gate pulses (scanning pulses) to the respective gate bus lines GL . . . There may be another gate driver that (i) is provided in a second region on the display panel 12, the second region being located to be adjacent to the display region 12a on a second side of the direction in which the gate bus lines GL . . . extend and that (ii) scans gate bus lines GL other than the gate bus lines GL that the gate driver 15 scans. Alternatively, there may be (i) a first gate driver provided in a first region located to be adjacent to the display region 12a on a first side of the direction in which the gate bus lines GL . . . extend and (ii) a second gate driver provided in a second region located to be adjacent to the display region 12a on a second side of the direction in which the gate bus lines GL . . . extend, the first and second gate drivers scanning identical gate bus lines GL. The above gate drivers are formed on the display panel 12 monolithically with the display region 12a. The gate driver 15 encompasses in scope any gate driver described with such terms as "gate monolithic", "gate driver free", "built-in-panel gate driver", and "gate in panel."

The flexible printed circuit board 13 includes a source driver 16, which supplies data signals to the respective source bus lines SL . . . The source driver 16 may be formed on the display panel 12 monolithically with the display region 12a. The control board 14 is connected to the flexible printed circuit board 13, and supplies necessary signals and power to the gate driver 15 and the source driver 16. The control board 14 outputs signals and power to be supplied to the gate driver 15, which signals and power are supplied to the gate driver 15 from the display panel 12 via the flexible printed circuit board 13.

The following describes, on the basis of embodiments, a configuration of a shift register included in the gate driver 15.

Embodiment 1

A first embodiment of the shift register is described below with reference to FIGS. 1 through 3, 7, and 15 through 17.

The description below first deals with, before the shift register of the present embodiment, a shift register that has a first basic configuration of the shift register of the present embodiment.

FIG. 16 illustrates a configuration of a shift register 21 having the first basic configuration.

The shift register 21 includes a plurality of stages Xi (where i is a natural number) that are provided in a number equal to the number of the gate bus lines GL . . . and that are connected to one another in cascade. The present embodiment and its subsequent embodiments use the term "cascade connection circuit" to refer to the above circuit made up of the stages Xi connected to one another in cascade. Each stage Xi includes terminals V1, V2, S1, S2, S3, S4, and OUT.

On each odd-numbered stage Xi (i=1, 3, 5 . . . ), the terminal V1 is supplied with a power source voltage (first direct current voltage) VDD, which is a gate drive voltage at a high level (that is, a gate pulse level); the terminal V2 is supplied with a power source voltage (second direct current voltage) VSS, which is the gate drive voltage at a low level; the terminal S1 is supplied with an output signal OUTi−1 from the terminal OUT of the immediately previous stage Xi−1; the terminal S2 is supplied with a clock signal (first clock signal) CLK1; the terminal S3 is supplied with an output signal OUTi+1 from the terminal OUT of the next stage X; the terminal S4 is supplied with a clock signal (first conduction-and-shutoff control signal; second clock signal) CLK2; and the terminal (first output terminal) OUT outputs an output signal OUTi of the odd-numbered stage Xi. The terminal S1 of the stage X1 is supplied with a gate start pulse SP instead of the output signal OUTi−1.

The terminal S3 of the final stage Xn for i is supplied with an output pulse signal from another stage in the cascade connection circuit, the output pulse signal being delayed in phase by one pulse from the output signal OUTi−1 of the final stage Xi. An example of such an output pulse signal is an output pulse signal from an output terminal of a dummy stage that is next to the final stage Xn, that is equivalent in configuration to the stage Xi, and that supplies no gate signal to a gate bus line GL. This output pulse from the dummy stage is referred to as "gate end pulse EP." The gate end pulse EP is identical in waveform to the pulse of the output signal OUTi and different only in phase from it. In this sense, the terminal S3 of each stage Xi may simply be supplied with an output pulse signal, from an output terminal of a predetermined other stage in the cascade connection circuit, which output pulse signal is delayed in phase (by one pulse, in the present embodiment) from the output signal OUTi of the stage Xi. Further, there may be a dummy stage immediately previous to the first stage X1, which dummy stage is equivalent to the above dummy stage and supplied with a gate start pulse, so that the first stage X1 is supplied with an output pulse signal from this dummy stage. The above dummy stages are provided so that the first stage X1 and the final stage Xn operate under the same conditions as those for any other stage Xi. The above description applies also to the other embodiments.

On each even-numbered stage Xi (i=2, 4, 6 . . . ), the terminal V1 is supplied with the power source voltage (first direct current voltage) VDD, which is the gate drive voltage at the high level (that is, the gate pulse level); the terminal V2 is supplied with the power source voltage (second direct current voltage) VSS, which is the gate drive voltage at the low level; the terminal S1 is supplied with an output signal OUTi−1 from the terminal OUT of the immediately previous stage Xi−1; the terminal S2 is supplied with the clock signal (first clock signal) CLK2; the terminal S3 is supplied with an output signal OUTi+1 from the terminal OUT of the next stage X+1; the terminal S4 is supplied with the clock signal CLK1; and the terminal OUT outputs an output signal OUTi of the even-numbered stage Xi.

The second direct voltage is lower than the first direct voltage.

FIG. 15 illustrates a configuration of each stage Xi included in the shift register having the above basic configuration.

The stage Xi includes transistors M1, M2, M3, M4, M5, and M6 and a capacitor C1. The transistors M1 through M6 in the present embodiment are all n-channel TFTs, but may be replaced with p-channel TFTs. This applies to all transistors, including a transistor M10 below, described in any embodiment. Each switching element described below has a gate serving as a terminal for controlling conduction and shutoff for the switching element.

The transistor (input gate; eighth switching element) M1 has (1) a gate connected to the terminal S1, (ii) a drain connected to the terminal V1, and (iii) a source connected to a node N1 connected to a gate of the transistor M5. The capacitor (first capacitor) C1 has a first end connected to the node N1.

The transistor (first switching element) M2 has (i) a gate connected to the terminal S2, (ii) a drain connected to the terminal V1, and (iii) a source connected to a second end of the capacitor C1, the second end being opposite to the first end connected to the node N1. The second end of the capacitor C1 is also connected to a node N2.

The transistor (second switching element) M3 has (i) a gate connected to the terminal S1, (ii) a drain connected to the node N2, and (iii) a source connected to the terminal V2.

The transistor (third switching element) M4 has (i) a gate connected to the terminal S3, (ii) a drain connected to the node N1, and (iii) a source connected to the terminal V2.

The transistor (first output transistor) M5 has (i) a drain connected to the terminal V1 and (ii) a source connected to the terminal OUT. This indicates that (i) a direct current voltage, that is, the power source voltage VDD, is applied to the drain of the transistor M5 and that (ii) the source of the transistor M5 functions as the first output terminal, which is an output terminal of the stage Xi.

The transistor (fourth switching element) M6 has (i) a gate connected to the terminal S4, (ii) a drain connected to the terminal OUT, and (iii) a source connected to the terminal V2.

Figure 17:
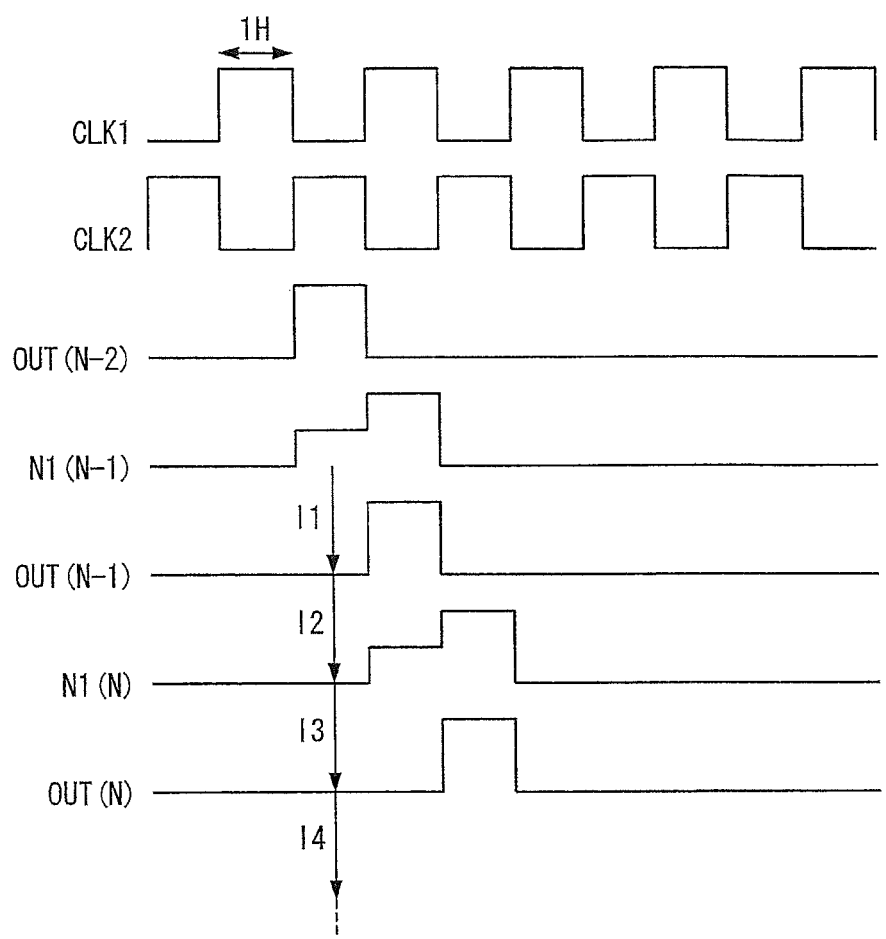
FIG. 17 is a waveform chart illustrating an operation of the shift register including a stage having the first basic configuration.

The following describes an operation of the shift register 21 with reference to FIG. 17.

The clock signals CLK1 and CLK2 have their respective active periods that do not overlap each other. The clock signals CLK1 and CLK2 in the present embodiment are opposite to each other in phase as an example. Further, in the present embodiment, the clock signals CLK1 and CLK2 each have (i) a high level equal to VDD and (ii) a low level equal to VSS. The clock signals CLK1 and CLK2 are, however, each simply required to have (i) a high level of VDD or higher and (ii) a low level of VSS or lower. The clock signals CLK1 and CLK2 and the gate start pulse SP (not shown) each have a pulse width corresponding to one horizontal period (1H). The gate start pulse SP is, for example, (i) a pulse that has one vertical cycle and that is shifted in phase from an active clock pulse of the clock signal CLK1 by half a cycle of the clock signal CLK1 or (ii) a pulse that has one vertical cycle and that is shifted in phase from an active clock pulse of the clock signal CLK2 by half a cycle of the clock signal CLK2. In the present embodiment, a clock signal supplied to the terminal S2 is the first clock signal. Thus, the first clock signal corresponds to (i) the clock signal CLK1 for each odd-numbered stage Xi and (ii) the clock signal CLK2 for each even-numbered stage Xi. Each stage Xi is supplied with a shift pulse and the first clock signal that have their respective active clock pulse periods (in the present embodiment, a high level period) that do not overlap each other.

First, when the terminal S1 of the stage X1 is supplied with a gate start pulse SP as a shift pulse, the transistors M1 and M3 are set to the ON state, which starts an operation of the stage X1. The stages Xi thus each sequentially output an output signal OUTi from the terminal OUT. The description below refers, for the stage Xi, to the node N1 as "node N1($i$)", the node N2 as "node N2($i$)", and the output signal OUTi as "OUT(i)."

The following assumes an example in which the stage X(N−2) for i=N−2 has outputted an output signal OUT(N−2) as illustrated in FIG. 17. This causes, on the next stage X(N−1), a voltage to be applied from the terminal V1 to the node N1(N−1) via the transistor M1, and the power source voltage VSS to be applied from the terminal V2 to the node N2(N−1) via the transistor M3. When the capacitor C1 has been charged until the potential of the node N1(N−1) reaches (power source voltage VDD)−(threshold voltage Vth of the transistor M1), the transistor M1 is set to the OFF state. This generates a potential difference of (power source voltage VDD)−(threshold voltage Vth of the transistor M1)−(power source voltage VSS) across the capacitor C1, and thus increases the potential of the node N1(N−1) and maintains the increased potential. The power source voltage VDD is set in magnitude so that a voltage (that is, a voltage of the terminal OUT) that is supplied to the terminal S1 of the next stage X(N) and that depends on the above-maintained potential of the node N1(N−1) is not larger than the threshold voltage Vth of the transistor M1 on the next stage X(N). The transistor M1, as described above, functions as an input gate that (i) is supplied with a shift pulse to the stage Xi and that (ii) passes, during a pulse period of the shift pulse, a voltage to be applied to the node N1. The shift pulse corresponds to (i) the gate start pulse SP for the stage X1 and (ii) for each of the other stages Xi, a gate pulse included in the output signal OUTi−1 from the previous stage Xi−1.

The pulse of the output signal OUT(N−2) then falls, which sets the transistor M3 to the OFF state.

Next, the clock signal CLK1, supplied from the terminal S2 as the first clock signal, rises to the high level, which sets the transistor M2 to the ON state. A voltage applied from the terminal V1 causes the node N2(N−1) to have a potential of (power source voltage VDD)−(threshold voltage Vth). This raises the potential of the node N1(N−1) via the capacitor C1, and thus sets the transistor M5 to the ON state. Since the potential difference of VDD−Vth−VSS is maintained across the capacitor C1 in this state, the potential V(N1) of the node N1(N−1) is expressed as follows:

$$V(N1) = (VDD - Vth - VSS) + (VDD - Vth) = 2 \times VDD - (VSS + 2 \times Vth).$$

The gate of the transistor M5, as a result, has a potential V(N1) that is sufficiently higher than VDD, and the transistor M5 is thus set to the ON state so as to have a sufficiently small channel resistance. This causes the power source voltage VDD as an output signal OUT(N−1) to be supplied from the terminal V1 to the terminal OUT via the transistor M5. The output signal OUT(N−1) outputted from the terminal OUT will serve as a gate pulse having an amplitude of VDD−VSS.

The above gate pulse is then supplied to the terminal S1 of the next stage X(N) and charges the capacitor C1 of the stage X(N). The clock signal CLK2, serving as the first clock signal, at the high level is supplied to the terminal S2, which in turn raises the potential of the node N1(N), and thus sets the transistor M5 to the ON state. This causes the power source voltage VDD as an output signal OUT(N) to be outputted from the terminal OUT via the transistor M5, and the output signal OUT(N) will serve as a gate pulse. The gate pulse of the output signal OUT(N) is then supplied to the terminal S3 of the stage X(N−1). This sets the transistor M4 to the ON state, and thus decreases the potential of the node N1(N−1) to the power source voltage VSS. The gate pulse as the output signal OUT(N−1) falls as a result, and resets the stage X(N−1).

The above operation causes the gate pulses of the respective output signals OUTi to be sequentially supplied to the respective gate bus lines GL.

For each stage Xi, the transistor M6 is set to the ON state each time a clock signal supplied to the terminal S4 is set at a high level. This resets the output terminal OUT to a low level.

The shift register 21, as described above, operates such that (i) the first direct current voltage, that is, the power source voltage VDD, is applied to the drain (that is, an end of the transistor M5 which end is opposite to an end via which a gate drive pulse is outputted) of the transistor M5 from which drain a gate pulse is outputted and that (ii) a switched capacitor operation is carried out with use of the transistors M2 and M3 and the capacitor C1. This arrangement prevents (i) a variation in an output voltage which variation is caused in the case where a clock signal is supplied to the drain of the transistor M5 and (ii) leakage of an electric charge from a liquid crystal picture element electrode which leakage is caused by the variation in an output voltage.

Further, the application of a direct current voltage to the drain of the transistor M5 makes it possible to drive the gate bus lines with use of a direct power source. This arrangement greatly reduces, as compared to the case in which gate bus lines are driven with use of a clock signal by supplying a clock signal to the drain of the transistor M5, load on an external level shifter that generates a control signal for the shift register.

The application of a direct current voltage to the drain of the transistor M5 increases a period during which a negative bias is applied between the gate and drain of the transistor M5, and thus reduces an increase in a threshold voltage. Not driving the gate bus lines with use of a clock signal allows the amplitude of a clock signal to be set to (i) any value of VSS or lower for a low level and (ii) to any value of VDD or higher for a high level. In the case where the high level is set to a value higher than VDD, an ON current is increased for a transistor that has a gate to which a clock signal at the high level is supplied, and the working speed is increased as a result. In the case where the low level is set to a value lower than VSS, an OFF current is decreased for a transistor that has a gate to which a clock signal at the low level is supplied, and it is consequently possible to prevent the level shifter from malfunctioning due to a leak current.

Further, in the case where the low level is set to a value lower than VSS, it is possible to set a gate potential to be lower than a source potential and a drain potential. This arrangement (i) reduces a change caused with time in the threshold voltage Vth by a direct current voltage component applied to the gate, and consequently (ii) prevents degradation in performance of the shift register.

Figure 24:
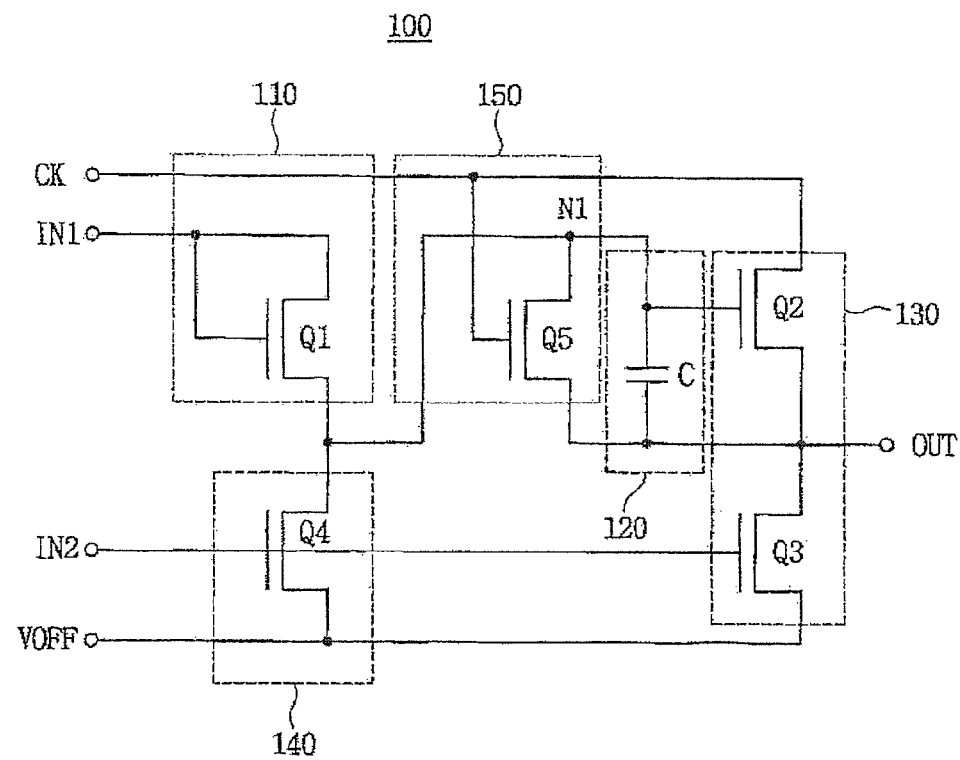
FIG. 24 is a circuit diagram illustrating a first example configuration of a stage included in a shift register of conventional art.
Figure 25:
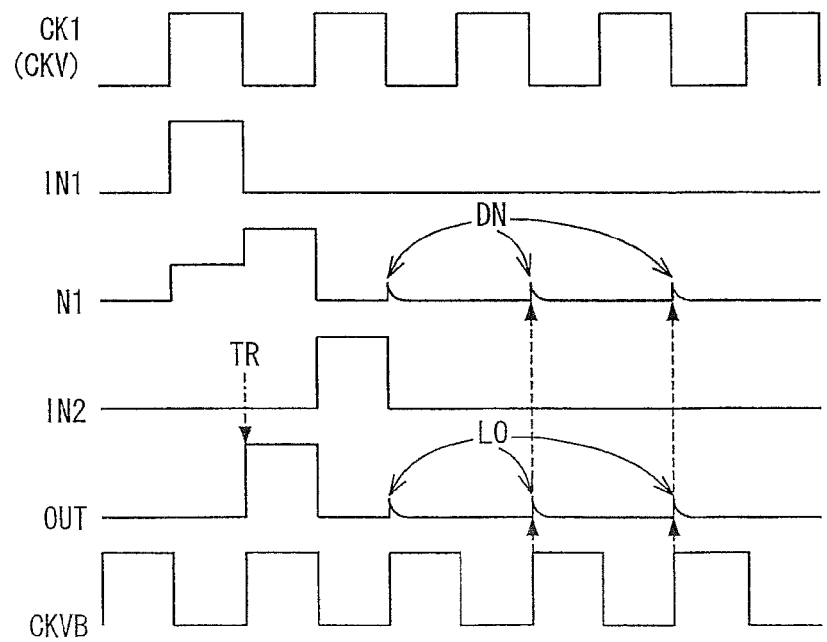
FIG. 25 is a first waveform chart illustrating a problem with a conventional shift register.
Figure 27:
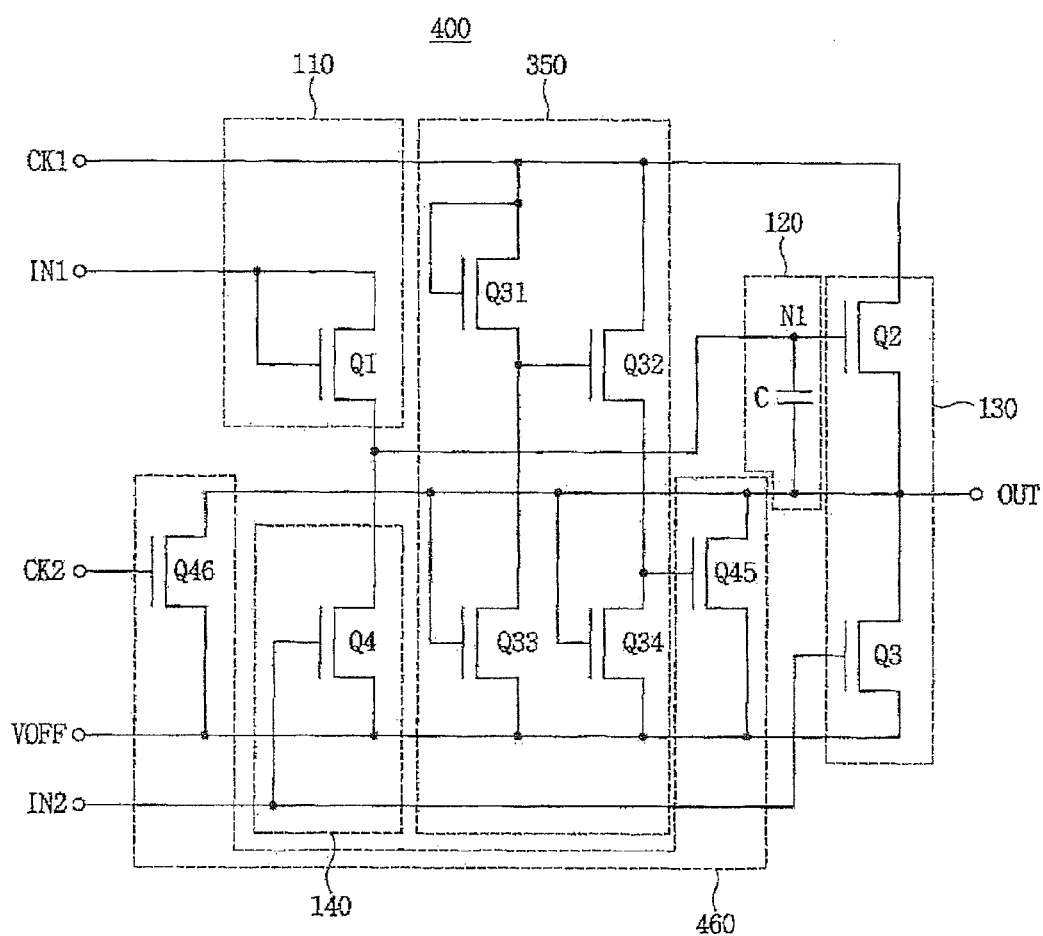
FIG. 27 is a circuit diagram illustrating a second example configuration of a stage included in a shift register of conventional art.

In the circuit configuration of Patent Literature 1, a clock signal is supplied to the drain of the output transistor Q2 illustrated in FIGS. 24 and 27, and consequently a variation in an output occurs with respect to each clock due to clock feed-through. In order to prevent such a variation in the output, a control signal for the transistor Q3 needs to be a clock signal.

By contrast, in the shift register 21, a direct voltage is supplied to the drain of the transistor M5. Thus, no noise is generated at the terminal OUT with respect to each clock. Therefore, it is possible to (i) supply an output pulse from a later stage as a control pulse to the gate of the transistor M6 and (ii) cause the terminal OUT to maintain a low level until a gate driver outputs signals during the next frame.

As described above, by supplying an output from a later stage into the gate of the transistor M6, it is possible to (i) avoid clock feed-through and shift in a threshold voltage which are caused by the input of a clock signal to the gate, and consequently (ii) satisfactorily prevent a variation in potential of the terminal OUT until a next output of the stage is made from the terminal OUT.

A part where a plurality of stages Xi of FIG. 15 are continuously cascade-connected to one another is referred to as a successive stage group. In the embodiment of FIG. 16, the cascade connection circuit is exactly equal to the successive stage group. However, the present invention is not limited to this. Alternatively, in the present invention, the cascade connection circuit may include, as a part thereof, the above successive stage group such that the cascade connection circuit includes the successive stage group and the dummy stage. In a case where a dummy stage has the same configuration as the configuration of a stage Xi defined in the claims of the present invention, a stage Xi cascade-connected to the dummy stage may also be regarded as a successive stage group. Further, a plurality of successive stage groups may be included in one cascade connection circuit in such a manner that at least one stage other than the stage Xi is positioned between the plurality of successive stage groups. Such a configuration can be preferably used in a case where each of the plurality of successive stage groups drives a plurality of gate bus lines GL which constitute a unit corresponding to that group. The above explanation applies also to the other embodiments.

The embodiments each describe an example involving only a single gate driver. The above cascade connection circuit can, however, be provided in a number of 1 or greater on a display panel. This is evident from the case in which a single gate driver may include a plurality of IC chips, and also from the case in which a plurality of gate drivers may be provided so as to sandwich the display region 12*a*.

In the shift register 21, the third switching element (in the present embodiment, the transistor M4) is simply required to have a conduction-and-shutoff control terminal that is supplied with a pulse signal which is delayed in phase from the shift pulse (in the present embodiment, the output signal OUTi) outputted from the terminal OUT of the stage Xi. The present embodiment is arranged such that each stage Xi other than the final stage is supplied with an output signal OUTi from the next stage Xi+1. The final stage Xi can be supplied the cascade connection circuit, such as an output signal from the above dummy stage.

In the shift register 21, the fourth switching element (in the present embodiment, the transistor M6) has a conduction-and-shutoff control terminal that is supplied with (i) for each stage Xi in the successive stage group other than the final stage, a shift pulse (in the present embodiment, the output signal OUTi) outputted from the terminal OUT of the next stage Xi+1 and (ii) for the final stage Xi in the successive stage group, a pulse signal which is delayed in phase from the shift pulse outputted from the terminal OUTi of the final stage Xi. The final stage Xi can be supplied with, for example, an output signal from a particular stage in the cascade connection circuit, such as an output signal from the above dummy stage.

The first direct current voltage applied to the gate of the transistor M1 may be replaced with a third direct current voltage. This arrangement avoids a charge potential of the node N1 from being restricted by the power source voltage VDD.

Each stage Xi having the configuration of FIG. 15 is likely interfered with by an operation of a previous stage or later stage under a condition in which (i) a current most likely flows through each transistor and (ii) a leak current is large, that is, normally at high temperatures or in an initial state of production. If the stage Xi is interfered with, there highly likely occurs a phenomenon in which such a signal interference causes a circuit to, for example, malfunction or oscillate. In the case where the transistors are TFTs, the above phenomenon is significant in particular because the TFTs each (i) need to be extremely large in dimension to compensate for a large ON resistance and thus (ii) have a large leak current.

The above phenomenon is caused as follows: In the case where a circuit is designed to increase an operating margin achieved under a condition in which a current is not likely to flow through each transistor, that is, an operating margin achieved in a state normally after low-temperature aging, each stage is subjected to a great signal interference by a previous stage or later stage in (i) a high-temperature state involving a large leak current or (ii) an initial state of production, in both of which a current is likely to flow through each transistor.

Specifically, the above signal interference can be caused as below.

In FIG. 17, for example, while the terminal S1 of the stage X(N–1) is supplied with a set signal, the stage X(N–1) is supplied with an output signal OUT(N–2) from the previous stage X(N–2), so that the node N1(N–1) is charged. During this period, the potential of the terminal OUT (N–1) is raised via a parasitic capacitor (for example, a source parasitic capacitor of the transistor M5) between the node N1(N–1) and the terminal OUT (N–1). This is indicated by an interference I1 in FIG. 17. In the case where the raised potential of the terminal OUT (N–1) causes the terminal S1 of the next stage X(N) to be supplied with an input that exceeds the threshold voltage of the transistor M1, the transistor M1 is set to the ON state, which charges the node N1(N) at a timing that is not originally intended (interference I2). The voltage of the node N1(N) is transmitted to the output signal OUT(N) (interference I3), and is further transmitted to the subsequent stages. (interferences N4, . . . ). This causes a circuit to malfunction or oscillate.

The present embodiment, in view of the above problem, describes a shift register that is based on the first basic configuration, that securely prevents (i) a variation caused in an output voltage by the above-described switched capacitor operation and (ii) leakage of an electric charge from a liquid crystal picture element electrode, and that prevents a circuit from malfunctioning or oscillating while a leak current is large. This improvement meets the need to deal with leakage, the need arising because there is a large variation in TFT properties, and thus a leak current likely varies greatly between TFTs in an identical circuit.

Figure 2:
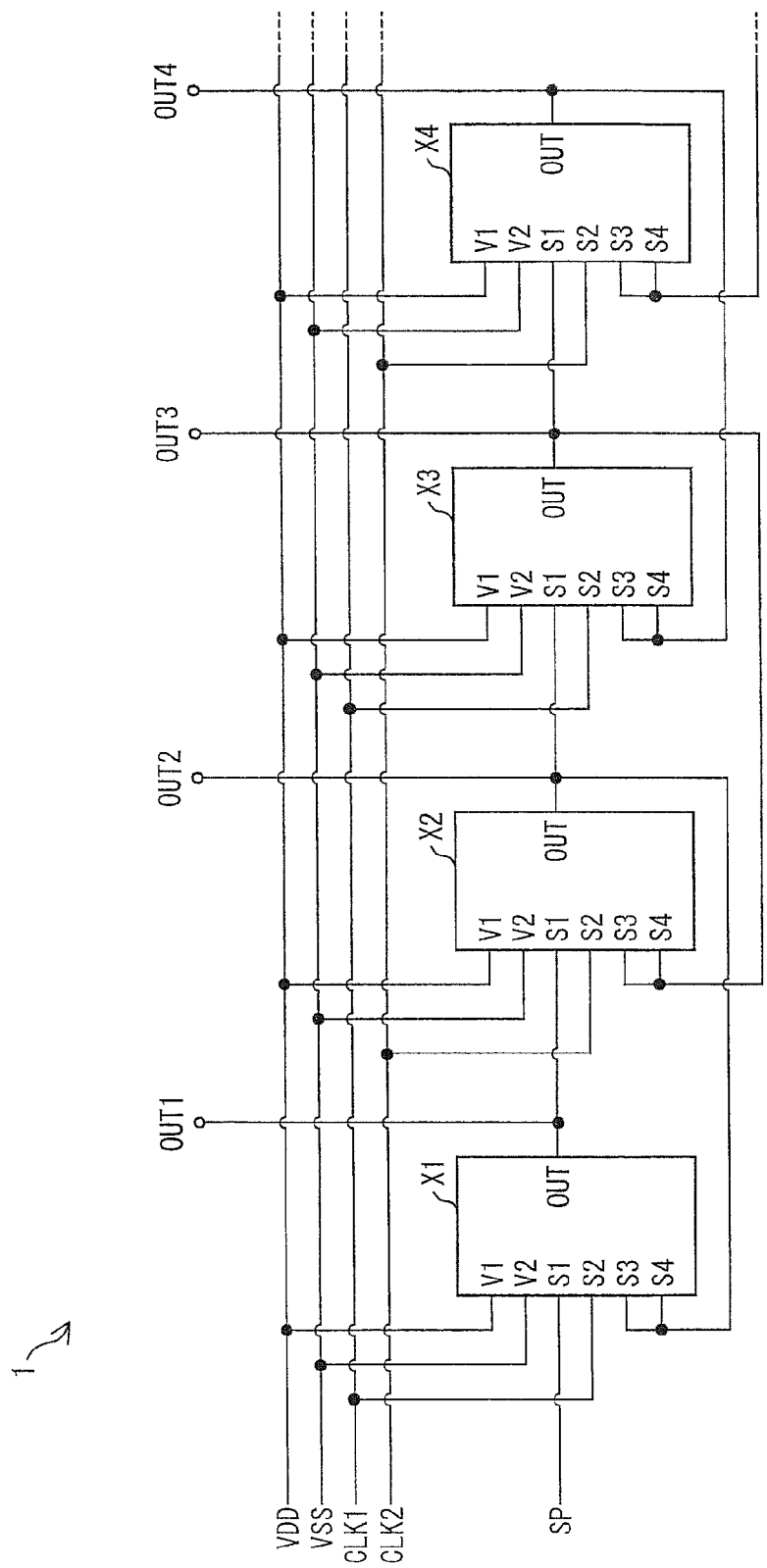
FIG. 2 is a block diagram illustrating a configuration of a shift register of the first embodiment.

FIG. 2 illustrates a configuration of a shift register 1 of the present embodiment.

The shift register 1, which is similar to the shift register 21 of FIG. 16, includes a plurality of stages Xi (where i is a natural number) that are provided in a number equal to the number of the gate bus lines GL . . . and that are connected to one another in cascade. The stages Xi each include terminals V1, V2, S1, S2, S3, S4, and OUT. The stages Xi of the shift register 1 are connected to one another in a manner identical to the manner in which the stages Xi of the shift register 21 are connected to one another. Such connection between the stages Xi of the shift register 1 is thus not described here. The final stage Xi can be arranged to be equivalent in configuration and operation to each stage Xi other than the final stage such that, for example, the terminal S4 of the final stage Xi is connected to the terminal OUT of the above dummy stage serving as a stage next to the final stage Xi.

Figure 1:
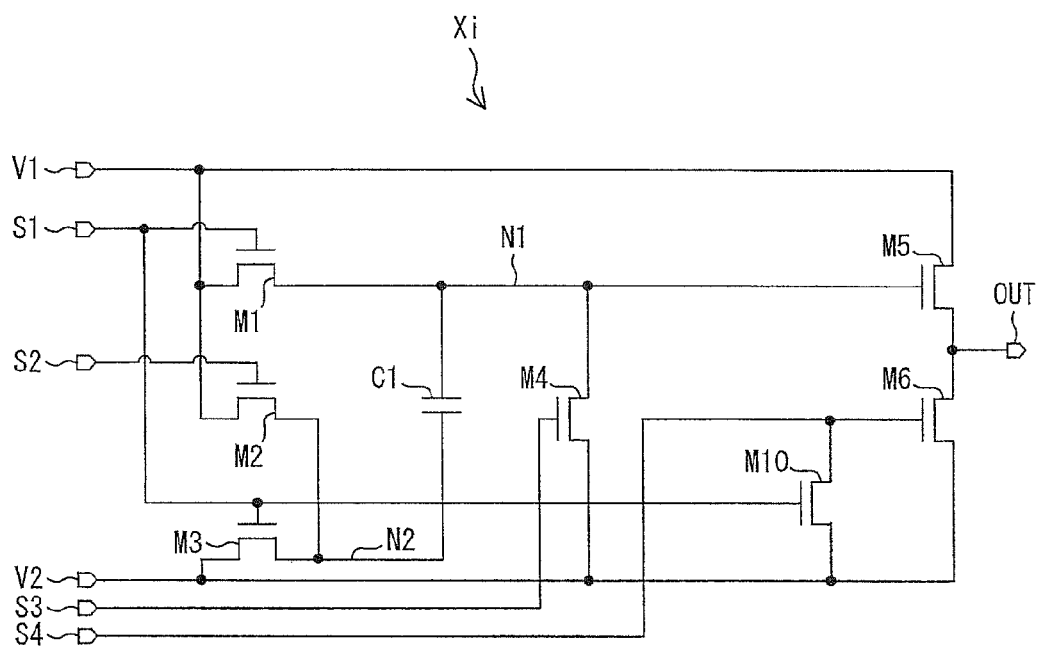
FIG. 1 is a circuit diagram illustrating a configuration of a stage included in a shift register of a first embodiment of the present invention.

FIG. 1 illustrates a configuration of each stage Xi of the shift register 1.

The stage Xi of the shift register 1 is identical to the stage Xi of the shift register 21 except that (i) a transistor M10 is added and that (ii) the terminal S4 is, instead of being supplied with a clock signal, connected to the terminal OUT, that is, an output terminal, of the next stage Xi.

The transistor (fifth switching element) M10 has (i) a gate connected to the terminal S1, (ii) a drain connected to the terminal S4 and thus to the gate of the transistor M6, and (iii) a source connected to the terminal V2.

The transistor M10 achieves the following: When the terminal S1 is supplied, from the immediately previous stage Xi−1, with a voltage having an active level or a level close to the active level, the transistor M10 is set to the ON state, which connects the terminal OUT of the next stage Xi+1 to the terminal V2. This arrangement reliably maintains the terminal OUT at the low level (the power source voltage VSS) while no voltage at the active level is outputted from the terminal OUT of the stage Xi.

Figure 3:
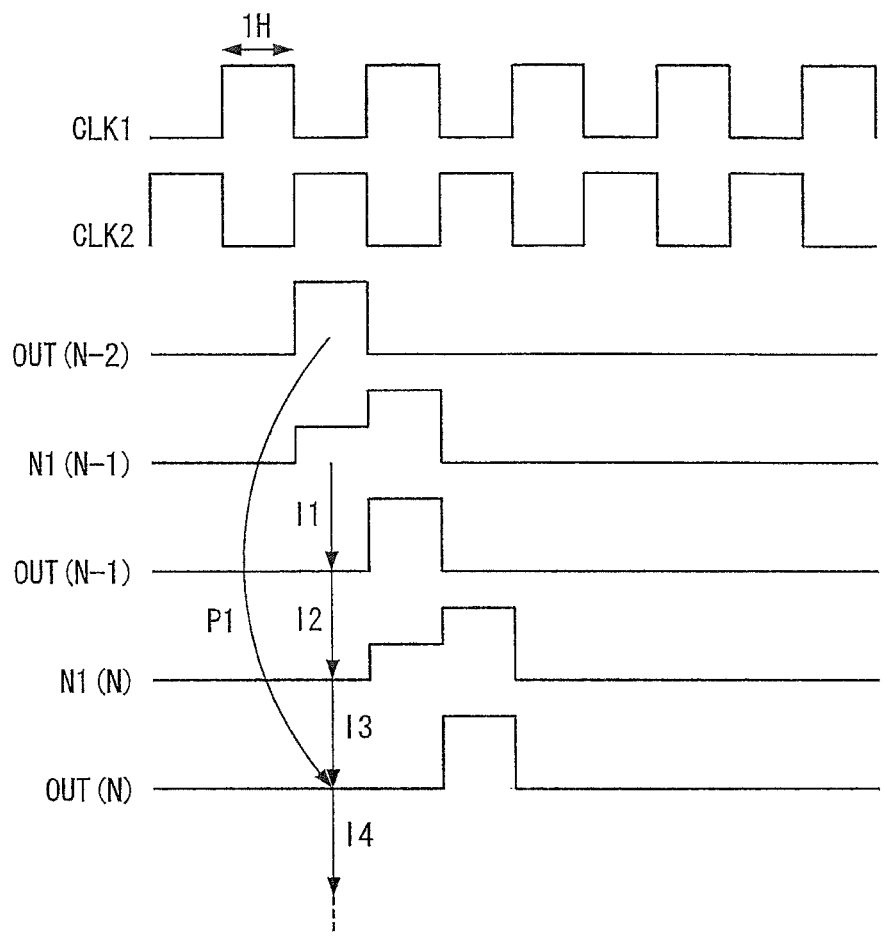
FIG. 3 is a waveform chart illustrating an operation of the shift register of the first embodiment.

The following describes an operation of the stage Xi of FIG. 1 in detail with reference to FIG. 3.

This operation differs from the operation illustrated in FIG. 17 in that since the terminal S4 is not supplied with a clock signal but connected to the terminal OUT of the next stage Xi+1, the transistor M6 is set to the ON state only while the output signal OUTi+1 of the next stage Xi is at the active level. Thus, even in the case where, for example, there occurs on the stage X(N−1), when an active output signal OUT(N−2) is outputted from the stage X(N−2), an interference I1 with an output signal OUT(N−1) via a parasitic capacitor of the transistor M5 for which a leak current is large, the interference I1, although it induces an interference I2 that causes the node N1(N) of the stage X(N) to be charged, does not cause an interference to be transmitted any further because the output signal OUT(N) is fixed at the low level.

As described above, the output signal OUTi of the stage Xi of the shift register 1 is subjected to a prevention effect P1 against interference due to (i) an output signal OUT(N−2) of the stage Xi−2 that is two stages previous or (ii) a signal equivalent to the output signal OUT(N−2). (a) of FIG. 7 illustrates how a large noise n1 occurs in an output signal OUTi due to interference in a shift register that does not include the transistor M10. This is contrasted with (b) of FIG. 7, which illustrates how such a noise n1 is reduced to a small noise n2 by including the transistor M10.

As described above, each stage Xi of the shift register 1 is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage.

Further, in the case where the transistor M10, which is connected to (i) the terminal OUT of the immediately previous stage Xi−1 and (ii) the terminal OUT of the next stage Xi+1, is provided on the stage Xi between the above two stages, it is possible to create an efficient circuit pattern layout that minimizes an increase in area and a delay caused by a parasitic component of wiring.

Embodiment 2

A second embodiment of the shift register is described below with reference to FIGS. 4 through 7 and 18 through 20.

The following describes a shift register having a second basic configuration for the shift register of the present embodiment.

Figure 18:
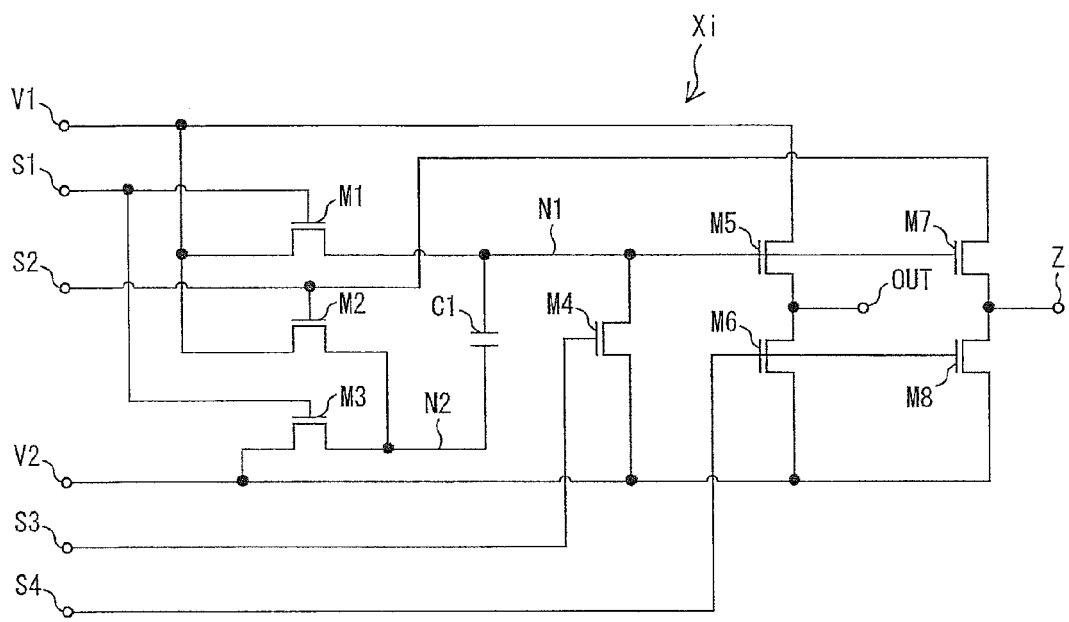
FIG. 18 is a circuit diagram illustrating a second basic configuration of a stage included in a shift register of an embodiment of the present invention.

FIG. 18 illustrates a configuration of a stage Xi included in the shift register having the second basic configuration.

The stage Xi of FIG. 18 differs from the stage Xi of FIG. 15 in that a transistor (second output transistor) M7 and a transistor (sixth switching element) M8 are added.

The transistor M7 has (i) a gate connected to the node N1, (ii) a drain connected to the terminal S2, and (iii) a source connected to a terminal (second output terminal) Z. This indicates that (i) the drain of the transistor M7 is supplied with the first clock signal and (ii) the source of the transistor M7 functions as a second output terminal, which is an output terminal of the stage Xi and which is different from the first output terminal. The transistor M8 has (i) a gate connected to the terminal S4 and thus to the gate of the transistor M6, (ii) a drain connected to the terminal Z, and (iii) a source connected to the terminal V2.

The terminal Z is connected to the terminal S1 of another stage Xi, which is supplied with a shift pulse outputted from the stage Xi including the terminal Z. The transistor M7 outputs a shift pulse. The transistor M8 resets the terminal Z to a low level.

As described above, in the shift register 22, a stage which outputs a gate pulse and a stage which outputs control signals such as a set signal (shift pulse) and a reset signal for setting/resetting another stage Xi are separate from each other. Note that any number of stages which are similarly separate from each other may be further provided.

In a case where the stage which outputs the control signals is further separated into (i) a stage which outputs the set signal (shift pulse) for the another stage and (ii) a stage which outputs the reset signal for the another stage, it is possible to (i) avoid an interference between the output of the set signal and the output of the reset signal and thus (ii) cause the shift register to operate more stably. In this case, for example, a third output transistor which is similar to the transistor M7 and a ninth switching element which is similar to the transistor M8 are added to the configuration of FIG. 18. A source of the third output transistor is a third output terminal which is an output terminal of the stage Xi and which is different from each of the first output terminal and the second output terminal. For example, the second output terminal (terminal Z) outputs the set signal (shift pulse), and the third output terminal outputs the reset signal.

As described above, since the drain of the transistor M7 which outputs the control signals for setting/resetting a previous stage Xi or a next stage Xi is connected with the terminal S2, it is possible to prevent the potential V(N1) of the node N1 from rising due to capacitive coupling, and thus prevent the potential of the terminal Z from increasing.

Figure 19:
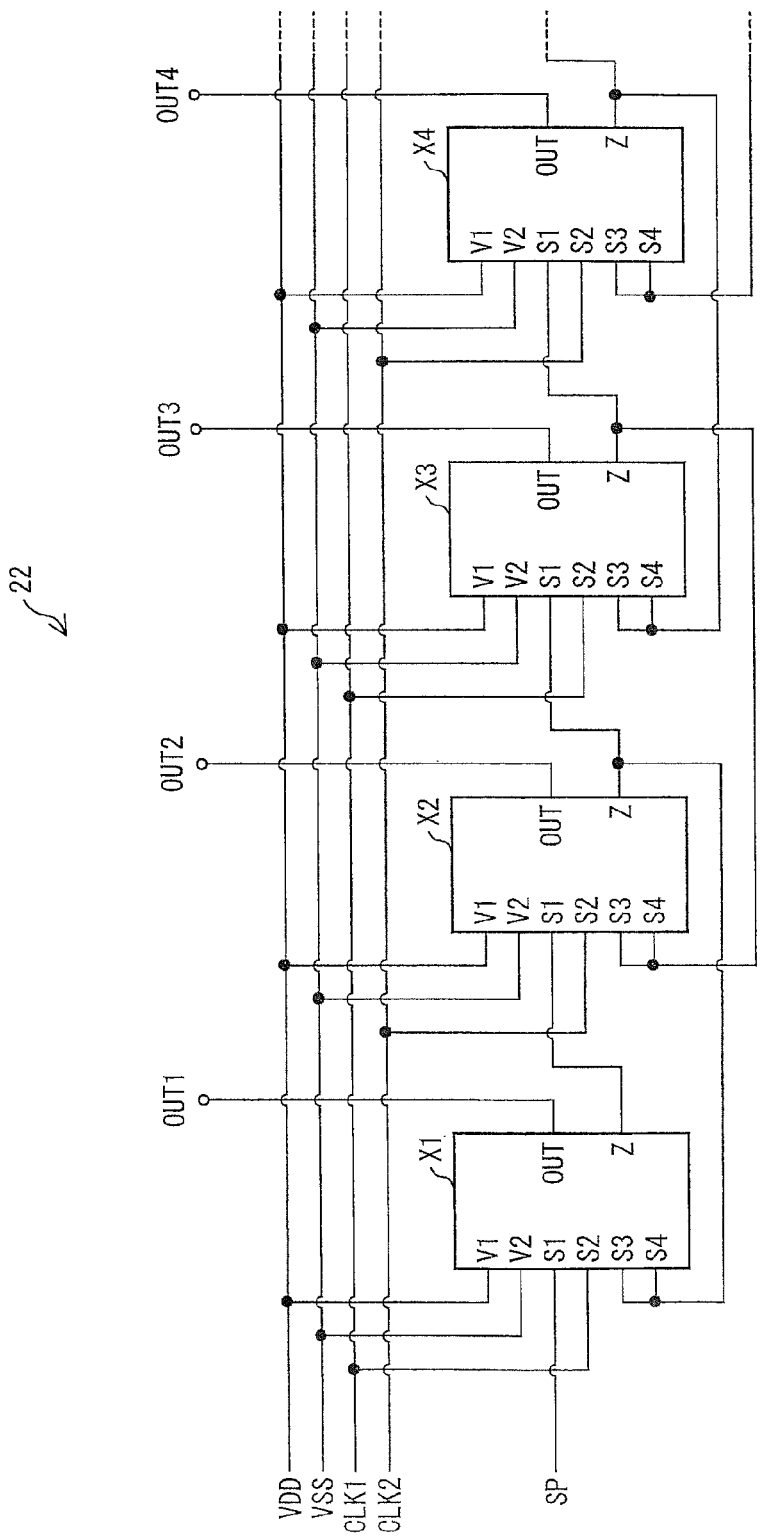
FIG. 19 is a block diagram illustrating a configuration of a shift register including a stage having the second basic configuration.

FIG. 19 illustrates a configuration of the shift register 22 having the second basic configuration.

The shift register 22 includes a plurality of stages Xi (where i is a natural number) that are provided in a number equal to the number of the gate bus lines GL . . . and that are connected to one another in cascade.

On each odd-numbered stage Xi (i=1, 3, 5 . . . ), the terminal V1 is supplied with a power source voltage (first direct current voltage) VDD, which is a gate drive voltage at a high level (that is, a gate pulse level); the terminal V2 is supplied with a power source voltage (second direct current voltage) VSS, which is the gate drive voltage at a low level; the terminal S1 is supplied with an output signal from the terminal Z of the immediately previous stage Xi−1; the terminal S2 is supplied with a clock signal (first clock signal) CLK1; the terminals S3 and S4 are each supplied with an output signal from the terminal Z of the next stage Xi+1; and the terminal OUT outputs an output signal OUTi of the odd-numbered stage Xi.

The terminal S1 of the stage X1 is supplied with a gate start pulse SP instead of the output signal OUTi−1.

On each even-numbered stage Xi (i=2, 4, 6 . . . ), the terminal V1 is supplied with the power source voltage (first direct current voltage) VDD, which is the gate drive voltage at the high level (that is, the gate pulse level); the terminal V2 is supplied with the power source voltage (second direct current voltage) VSS, which is the gate drive voltage at the low level; the terminal S1 is supplied with an output signal from the terminal Z of the immediately previous stage Xi−1; the terminal S2 is supplied with the clock signal (first clock signal) CLK2; the terminals S3 and S4 are each supplied with an output signal from the terminal Z of the next stage X+1; and the terminal OUT outputs an output signal OUTi of the even-numbered stage Xi.

The second direct voltage is lower than the first direct voltage.

FIG. 20 illustrates operation waveforms of the shift register 22.

The clock signals CLK1 and CLK2 each have a pulse width of 1 H, and are opposite to each other in phase. The gate start pulse SP corresponds to one clock pulse of the clock signal CLK2.

With this arrangement, in a case where a shift pulse is inputted to the terminal S1 so that the transistor M5 is set to the ON state by a potential VDD-Vth of the node N1, a gate pulse outputted from the terminal OUT is outputted only during a period which corresponds to two clock pulses and during which a potential increases in a step-like manner as shown by the waveforms of the output signals OUT(N−1), OUT(N), . . . Meanwhile, a shift pulse outputted from the terminal Z is outputted only during a period corresponding to one clock pulse of the clock signals CLK1 and CLK2 which period corresponds to the latter half of a period of a gate pulse of the stage X1 as shown by the waveforms of the output signals Z(N−1), Z(N), . . . Accordingly, (i) during the former half of a period of the gate pulse, precharging of a picture element can be carried out, and (ii) during the latter half of the period, main writing of a data signal can be carried out and a shift pulse can be transmitted to the next stage Xi+1.

Use of the shift register 22 makes it possible to reduce, as compared to the shift register 21 of FIG. 16, the number of clock signals which are input signals necessary for obtaining equivalent output signals for precharging.

With the shift register 22, it is possible to prevent the potential V (N1) of the node N1 from rising due to capacitive coupling, and thus prevent an output from the terminal Z from rising during an unnecessary period, thereby preventing the shift register from malfunctioning. Further, it is possible to reduce the number of required input signals externally supplied to the shift register.

Each stage Xi of the shift register 22 poses a problem similar to the problem with each stage Xi having the configuration of FIG. 15.

In FIG. 20, for example, charging of the node N1(N−1) interferes with the potential of the terminal Z (N−1) (interference I1), which in turn causes the node N1(N) of the next stage X(N) to be charged at a timing that is not originally intended (interference I2). The interference I2 is transmitted to a later stage similarly (interference I3).

The present embodiment, in view of the above problem, describes a shift register that is based on the second basic configuration, that securely prevents (i) a variation caused in an output voltage by the above-described switched capacitor operation and (ii) leakage of an electric charge from a liquid crystal picture element electrode, and that prevents a circuit from malfunctioning or oscillating while a leak current is large.

Figure 5:
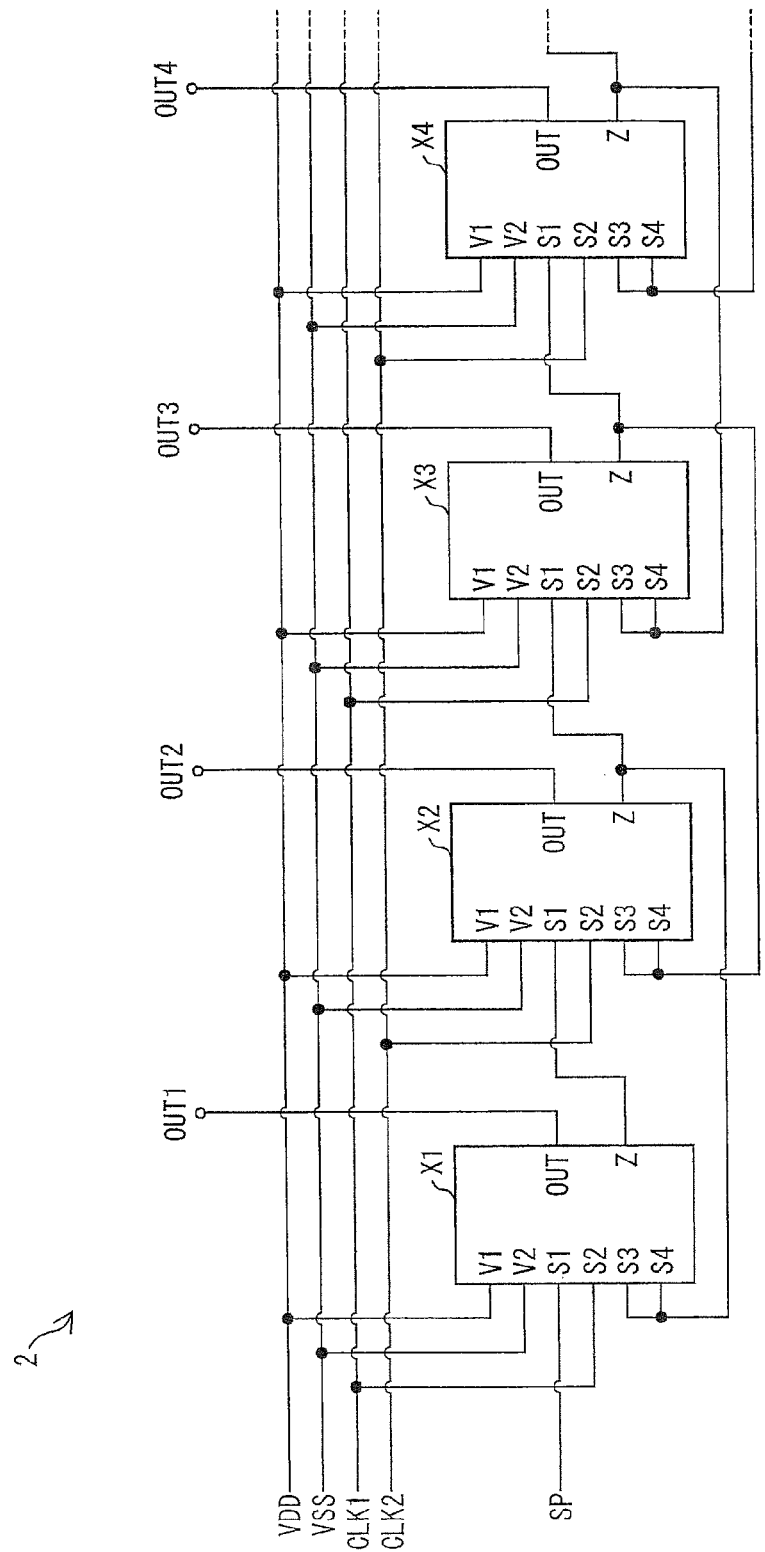
FIG. 5 is a block diagram illustrating a configuration of a shift register of the second embodiment.

FIG. 5 illustrates a configuration of a shift register 2 of the present embodiment.

The shift register 2, which is similar to the shift register 22 of FIG. 19, includes a plurality of stages Xi (where i is a natural number) that are provided in a number equal to the number of the gate bus lines GL . . . and that are connected to one another in cascade. The stages Xi each include terminals V1, V2, S1, S2, S3, S4, OUT, and Z. The stages Xi of the shift register 2 are connected to one another in a manner identical to the manner in which the stages Xi of the shift register 22 are connected to one another. Such connection between the stages Xi of the shift register 2 is thus not described here. The final stage Xi can be arranged to be equivalent in configuration and operation to each stage Xi other than the final stage such that, for example, the terminal S4 of the final stage Xi is connected to the terminal Z of the above dummy stage serving as a stage next to the final stage Xi.

Figure 4:
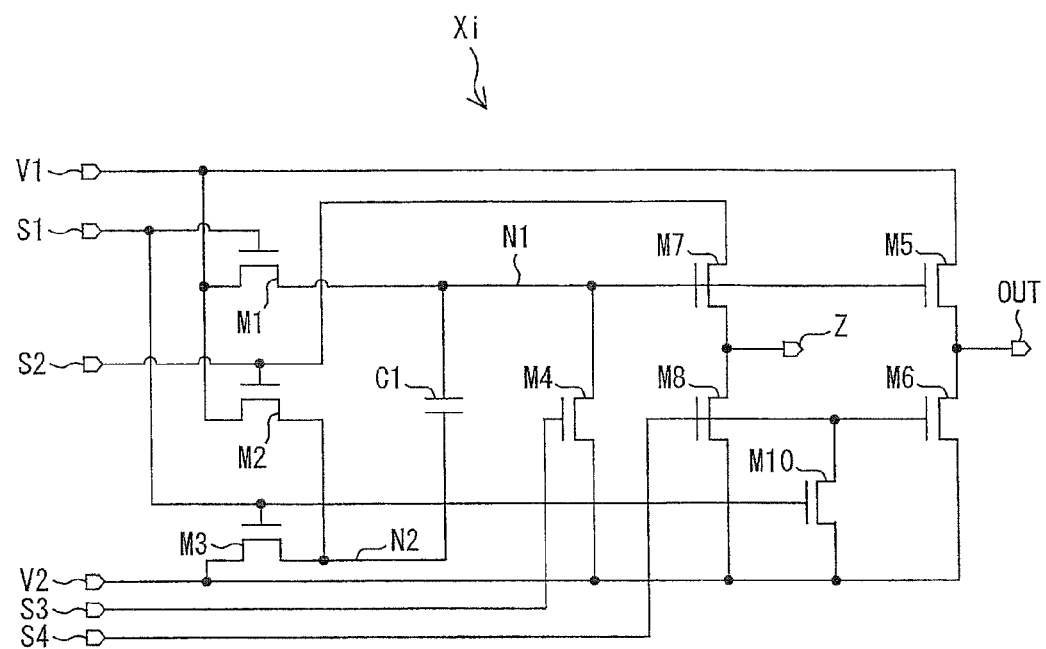
FIG. 4 is a circuit diagram illustrating a configuration of a stage included in a shift register of a second embodiment of the present invention.

FIG. 4 illustrates a configuration of each stage Xi of the shift register 2.

The stage Xi of the shift register 2 is identical to the stage Xi of the shift register 22 except that a transistor M10 is added.

The transistor (fifth switching element) M10 has (i) a gate connected to the terminal S1, (ii) a drain connected to the terminal S4, and (iii) a source connected to the terminal V2.

The transistor M10 achieves the following: When the terminal S1 is supplied, from the immediately previous stage Xi−1, with a voltage having an active level or a level close to the active level, the transistor M10 is set to the ON state, which connects the terminal Z of the next stage Xi+1 to the terminal V2. This arrangement reliably maintains the terminal Z at the low level (the power source voltage VSS) while no voltage at the active level is outputted from the terminal Z of the stage Xi.

Figure 6:
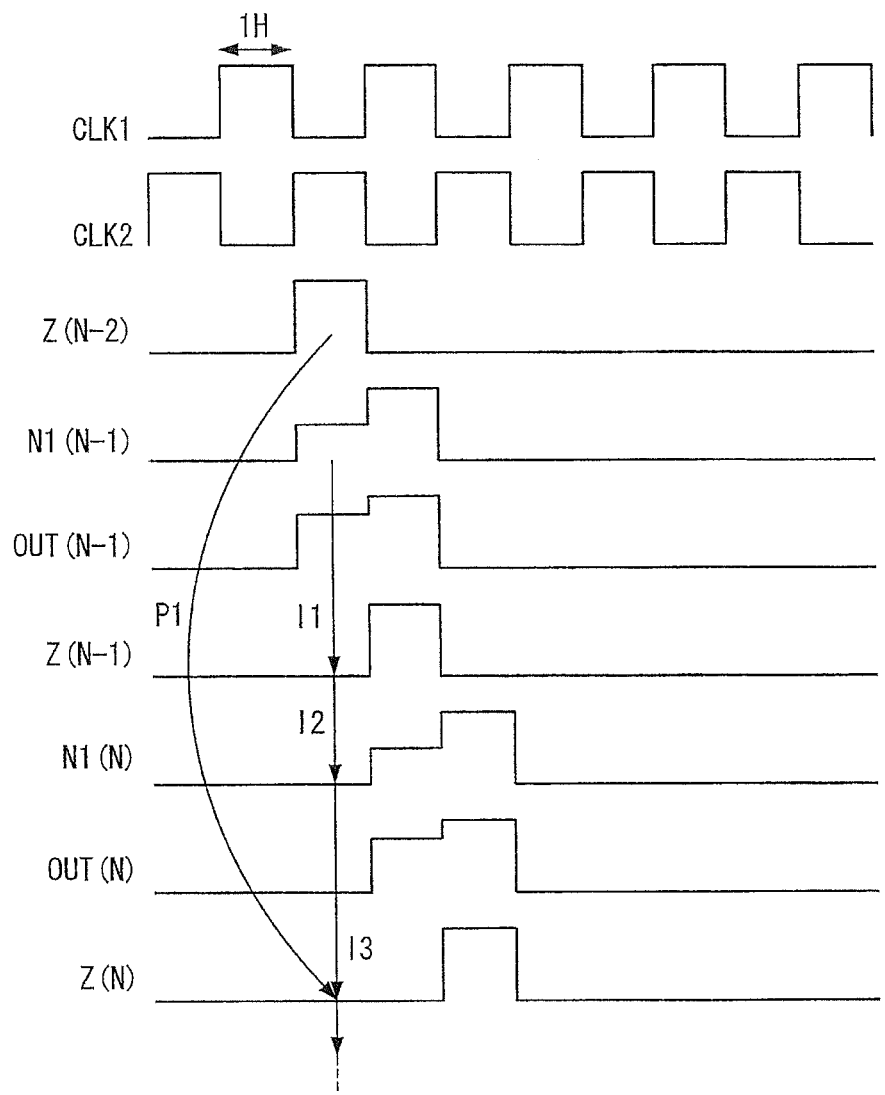
FIG. 6 is a waveform chart illustrating an operation of the shift register of the second embodiment.

The following describes an operation of the stage Xi of FIG. 4 in detail with reference to FIG. 6.

Even in the case where there occurs on the stage X(N−1), when an active output signal Z(N−2) is outputted from the stage X(N−2), an interference I1 with an output signal Z(N−1) via a parasitic capacitor of the transistor M5 for which a leak current is large, the interference I1, although it induces an interference I2 that causes the node N1(N) of the stage X(N) to be charged, does not cause an interference to be transmitted any further because the output signal Z(N) is fixed at the low level.

As described above, the output signal Zi of the stage Xi of the shift register 1 is subjected to a prevention effect P1 against interference due to (i) an output signal Z(N−2) of the stage Xi−2 that is two stages previous or (ii) a signal equivalent to the output signal Z(N−2). This achieves, as in Embodiment 1, the effect illustrated in (b) of FIG. 7.

As described above, each stage Xi of the shift register 2 is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage.

Further, in the case where the transistor M10, which is connected to (i) the terminal Z of the immediately previous stage Xi−1 and (ii) the terminal Z of the next stage Xi+1, is provided on the stage Xi between the above two stages, it is possible to create an efficient circuit pattern layout that minimizes an increase in area and a delay caused by a parasitic component of wiring.

Embodiment 3

A third embodiment of the shift register is described below with reference to FIGS. 8 through 10 and 14.

Figure 9:
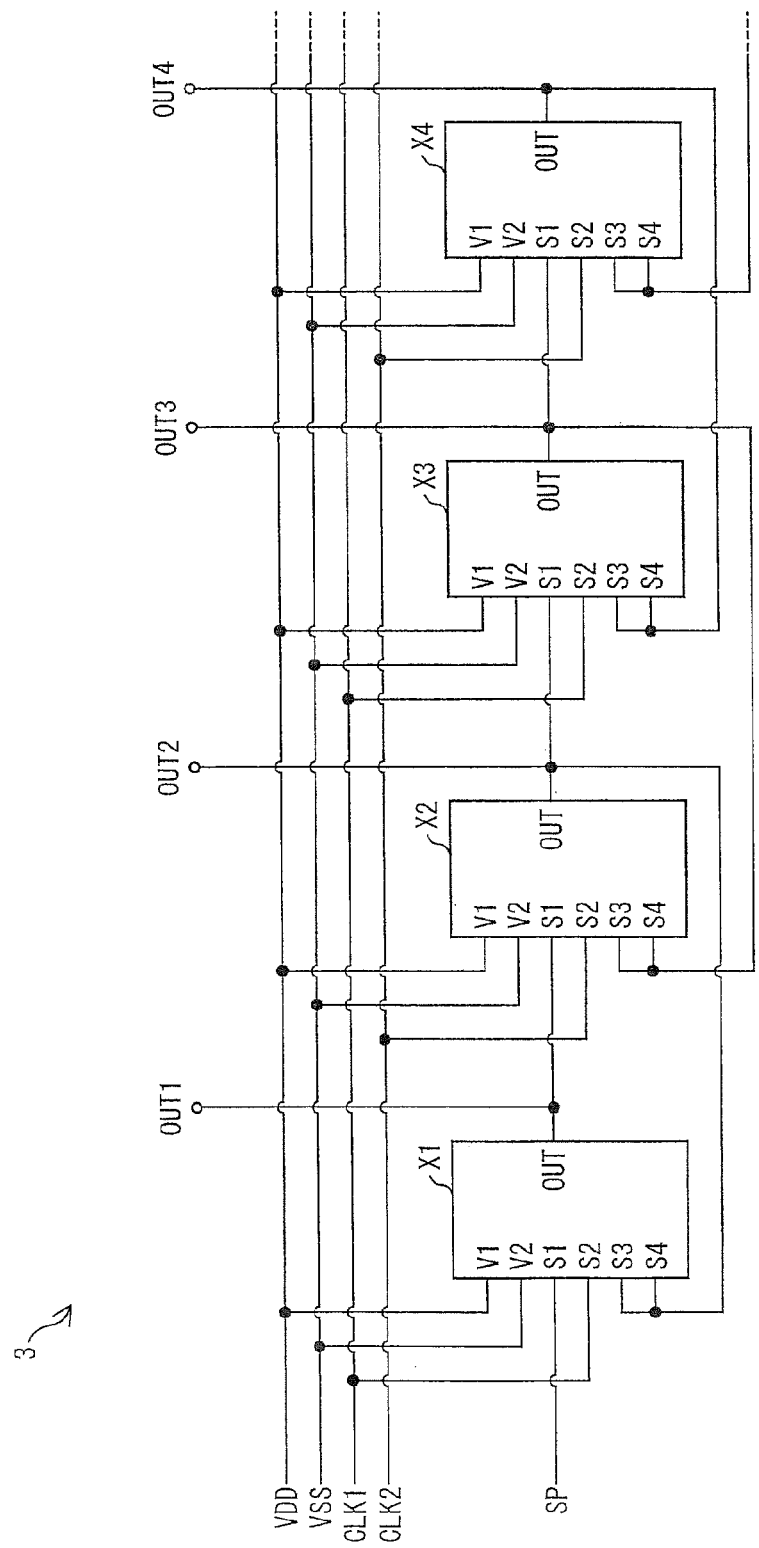
FIG. 9 is a block diagram illustrating a configuration of a shift register of the third embodiment.

FIG. 9 illustrates a configuration of a shift register 3 of the present embodiment.

The shift register 3, which is similar to the shift register 21 of FIG. 16, includes a plurality of stages Xi (where i is a natural number) that are provided in a number equal to the number of the gate bus lines GL . . . and that are connected to one another in cascade. The stages Xi each include terminals V1, V2, S1, S2, S3, S4, and OUT. The stages Xi of the shift register 3 are connected to one another in a manner identical to the manner in which the stages Xi of the shift register 21 are connected to one another. Such connection between the stages Xi of the shift register 3 is thus not described here.

FIG. 8 illustrates a configuration of each stage Xi of the shift register 3.

The stage Xi of the shift register 3 is identical to the stage Xi of the shift register 21 except that (i) a transistor M11 is added and that (ii) the terminal S4 is, instead of being supplied with a clock signal, connected to the terminal OUT, that is, an output terminal, of the next stage Xi. The final stage Xi can be arranged to be equivalent in configuration and operation to each stage Xi other than the final stage such that, for example, the terminal S4 of the final stage Xi is connected to the terminal OUT of the above dummy stage serving as a stage next to the final stage Xi.

The transistor (seventh switching element) M11 has (i) a gate connected to the terminal S4 and thus to the gate of the transistor M6, (ii) a drain connected to the terminal S1, and (iii) a source connected to the terminal V2.

The transistor M11 achieves the following: When the output signal OUTi of the next stage Xi+1 is set at an active level, the transistor M11 is set to the ON state, which connects the terminal S1 of the stage Xi including the transistor M11 to the terminal V2, that is, connects the terminal OUT of the immediately previous stage Xi−1 to the terminal V2. This arrangement prevents the node N1 from (i) being unnecessarily charged due to a leak current via the transistor M1 after the node N1 of the stage Xi is reset, and from (ii) being subjected to an unnecessary potential rise, which causes an interference, through an unnecessary electric charge of the capacitor C1 when the transistor M2 is set to the ON state.

Figure 10:
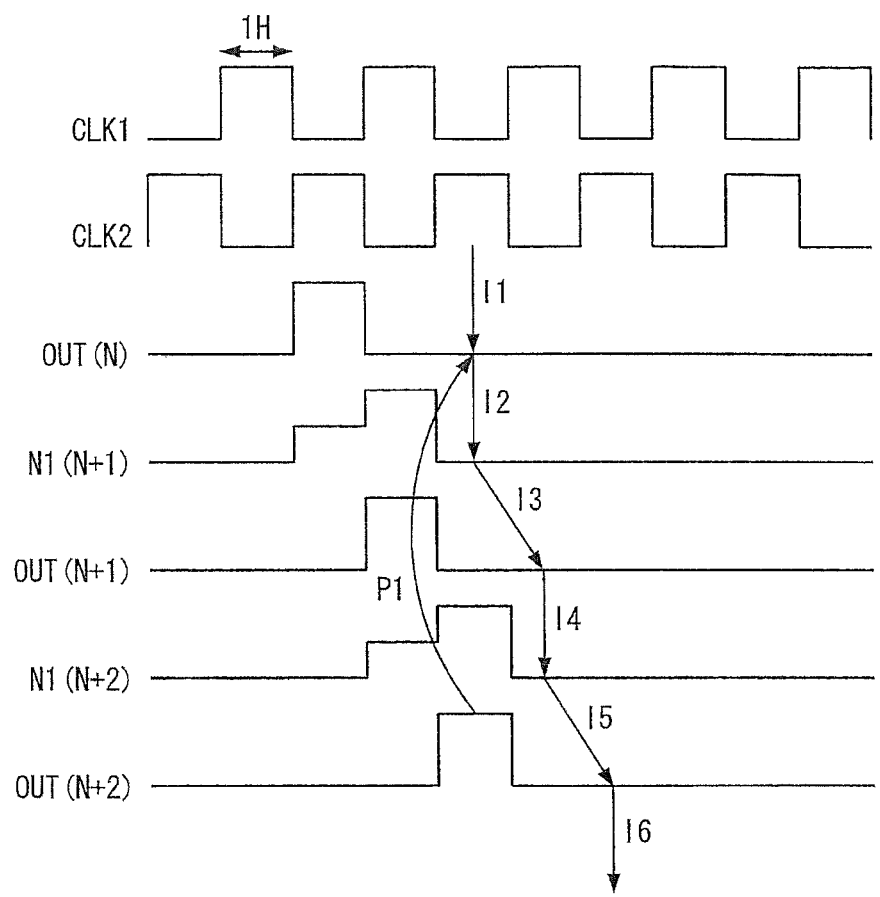
FIG. 10 is a waveform chart illustrating an operation of the shift register of the third embodiment.

The following describes an operation of the stage Xi of FIG. 8 in detail with reference to FIG. 10.

This operation differs from the operation illustrated in FIG. 17 in that since the terminal S4 is not supplied with a clock signal but connected to the terminal OUT of the next stage Xi+1, the transistor M6 is set to the ON state only while the output signal OUTi+1 of the next stage is at the active level. When the node N1(N+1) is reset by an output signal OUT (N+2) of the stage X(N+2) after an active output signal OUT (N+1) is outputted from the stage X(N+1), an unnecessary component (interference I1) of an output signal OUT(N) which unnecessary component is generated by a leak current causes the node N1(N+1) of the stage X(N+1) to be charged due to a leak current of the transistor M1 (interference I2). This interference I2 affects the output signal OUT(N+1) at a timing of the next clock pulse (interference I3), and is thus supposed to be sequentially transmitted to a later stage. However, the transistor M11 fixes the output signal OUT(N) at a low level, and thus prevents the node N1(N+1) from being unnecessarily charged. The above interference is, in consequence, not transmitted any further.

As described above, the output signal OUTi of the stage Xi of the shift register 1 is subjected to a prevention effect P1 against interference due to (i) an output signal OUT(N+2) of the stage Xi+2 that is two stages later or (ii) a signal equivalent to the output signal OUT(N+2). (a) of FIG. 14 illustrates how a large noise n1 occurs in an output signal OUTi due to interference in a shift register that does not include the transistor M11. This is contrasted with (b) of FIG. 14, which illustrates how such a noise n1 is reduced to a small noise n2 by including the transistor M11.

As described above, each stage Xi of the shift register 3 is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage.

Further, in the case where the transistor M11, which is connected to (i) the terminal OUT of the immediately previous stage Xi−1 and (ii) the terminal OUT of the next stage Xi+1, is provided on the stage Xi between the above two stages, it is possible to create an efficient circuit pattern layout that minimizes an increase in area and a delay caused by a parasitic component of wiring.

Embodiment 4

A fourth embodiment of the shift register is described below with reference to FIGS. 11 through 14.

Figure 12:
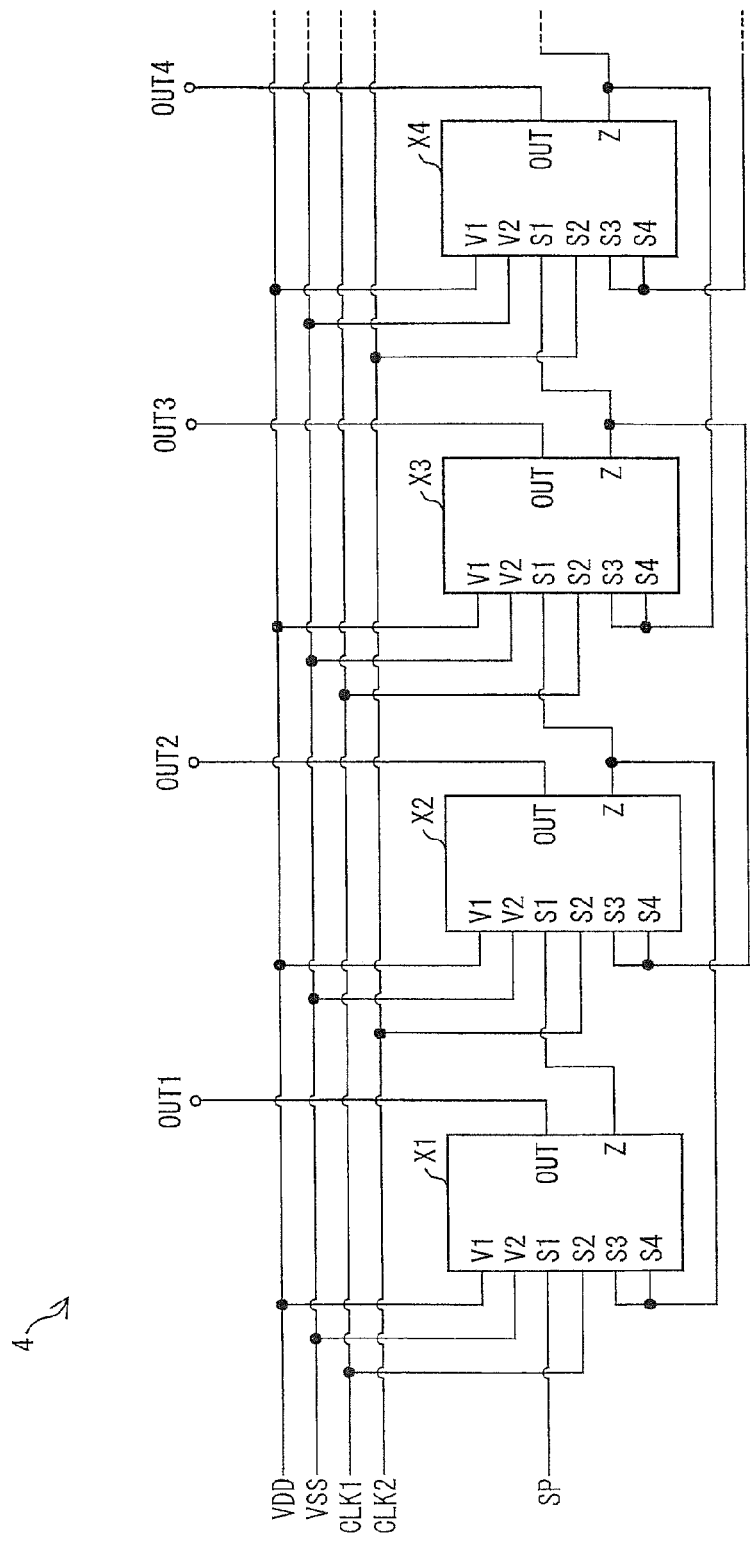
FIG. 12 is a block diagram illustrating a configuration of a shift register of the third embodiment.

FIG. 12 illustrates a configuration of a shift register 4 of the present embodiment.

The shift register 4, which is similar to the shift register 22 of FIG. 19, includes a plurality of stages Xi (where i is a natural number) that are provided in a number equal to the number of the gate bus lines GL . . . and that are connected to one another in cascade. The stages Xi each include terminals V1, V2, S1, S2, S3, S4, OUT, and Z. The stages Xi of the shift register 3 are connected to one another in a manner identical to the manner in which the stages Xi of the shift register 22 are connected to one another. Such connection between the stages Xi of the shift register 4 is thus not described here. The final stage Xi can be arranged to be equivalent in configuration and operation to each stage Xi other than the final stage such that, for example, the terminal S4 of the final stage Xi is connected to the terminal Z of the above dummy stage serving as a stage next to the final stage Xi.

FIG. 11 illustrates a configuration of each stage Xi of the shift register 3.

The stage Xi of the shift register 4 is identical to the stage Xi of the shift register 22 except that a transistor M11 is added.

The transistor (seventh switching element) M11 has (i) a gate connected to the terminal S4 and thus to the gate of the transistor M6, (ii) a drain connected to the terminal S1, and (iii) a source connected to the terminal V2.

The transistor M11 achieves the following: When the output signal Zi of the next stage Xi+1 is set at an active level, the transistor M11 is set to the ON state, which connects the terminal S1 of the stage Xi including the transistor M11 to the terminal V2, that is, connects the terminal Z of the immediately previous stage Xi−1 to the terminal V2. This arrangement prevents the node N1 from (i) being unnecessarily charged due to a leak current via the transistor M1 after the node N1 of the stage Xi is reset, and from (ii) being subjected to an unnecessary potential rise, which causes an interference, through an unnecessary electric charge of the capacitor C1 when the transistor M2 is set to the ON state.

Figure 13:
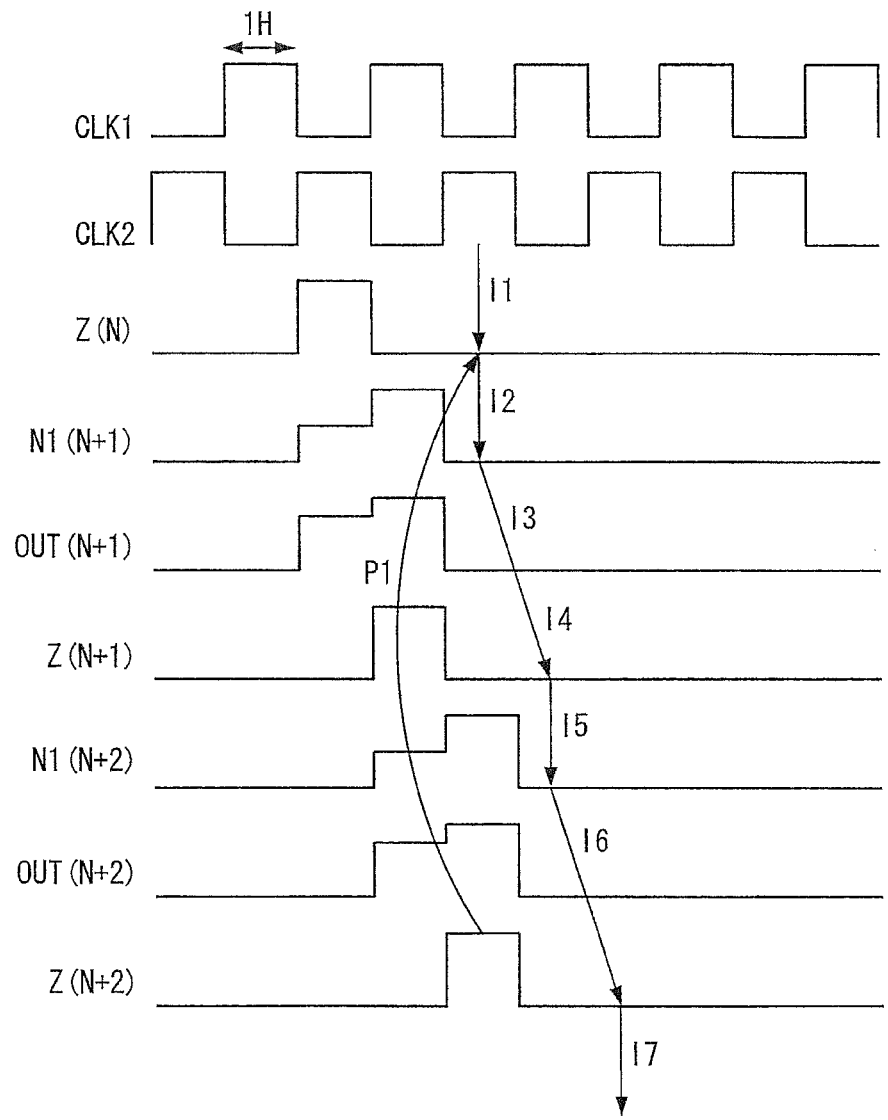
FIG. 13 is a waveform chart illustrating an operation of the shift register of the third embodiment.

The following describes an operation of the stage Xi of FIG. 11 in detail with reference to FIG. 13.

When the node N1(N+1) is reset by an output signal Z(N+2) of the stage X(N+2) after an active output signal Z(N+1) is outputted from the stage X(N+1), an unnecessary component (interference I1) of an output signal Z(N) which unnecessary component is generated by a leak current causes the node N1(N+1) of the stage X(N+1) to be charged due to a leak current of the transistor M1 (interference I2). This interference I2 affects the output signal Z(N+1) at a timing of the next clock pulse (interference I3), and is thus supposed to be sequentially transmitted to a later stage. However, the transistor M11 fixes the output signal Z(N) at a low level, and thus prevents the node N1(N+1) from being unnecessarily charged. The above interference is, in consequence, not transmitted any further.

As described above, the output signal Zi of the stage Xi of the shift register 1 is subjected to a prevention effect P1 against interference due to (i) an output signal Z(N+2) of the stage Xi+2 that is two stages later or (ii) a signal equivalent to the output signal Z(N+2). This achieves, as in Embodiment 3, the effect illustrated in (b) of FIG. 14.

As described above, each stage Xi of the shift register 4 is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage.

Further, in the case where the transistor M11, which is connected to (i) the terminal Z of the immediately previous stage Xi−1 and (ii) the terminal Z of the next stage Xi+1, is provided on the stage Xi between the above two stages, it is possible to create an efficient circuit pattern layout that minimizes an increase in area and a delay caused by a parasitic component of wiring.

The embodiments of the present invention are described above.

Figure 22:
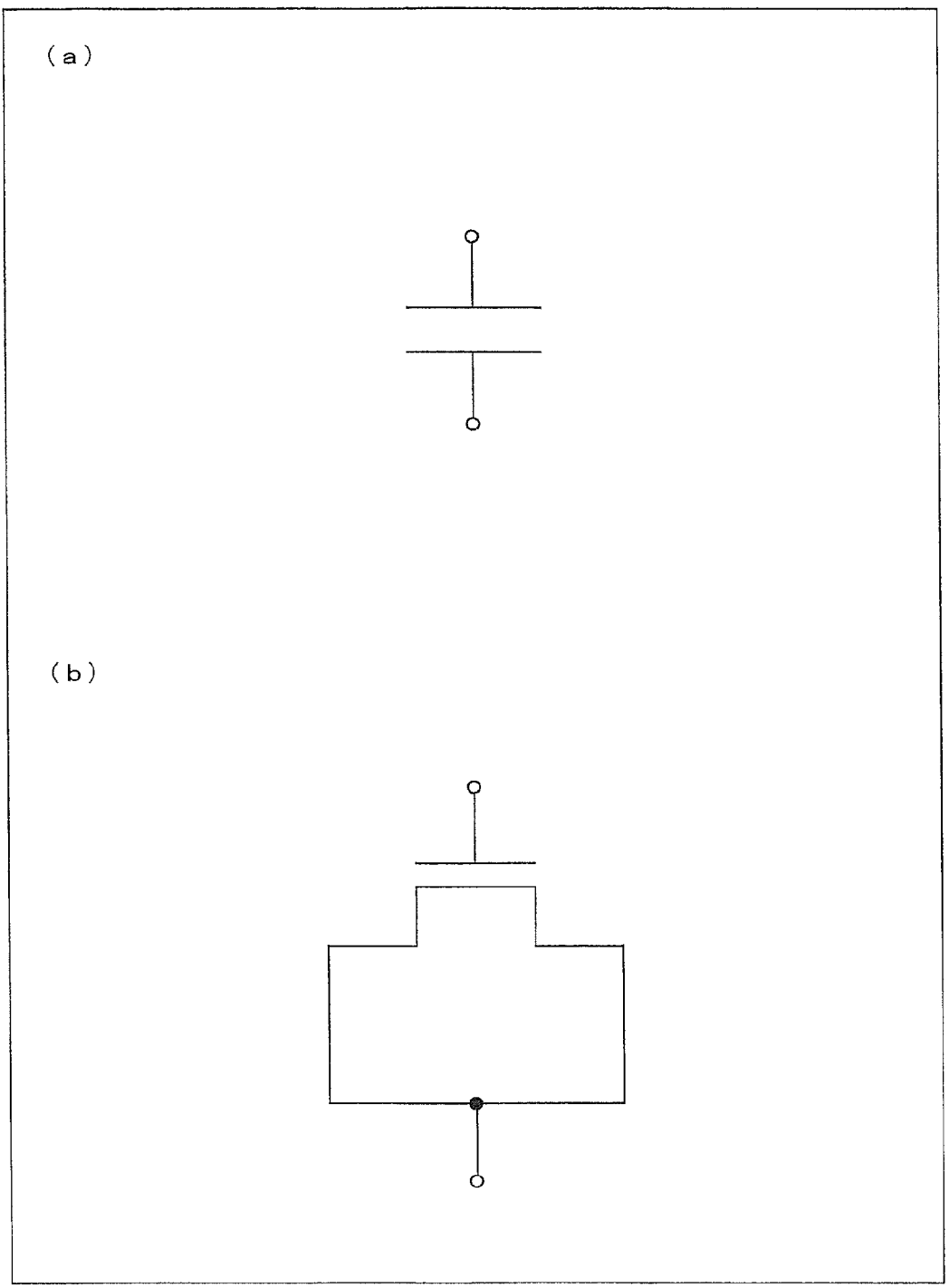
FIG. 22 illustrates circuit diagrams each illustrating a form of a capacitor of an embodiment of the present invention, where (a) is a circuit diagram illustrating a first form of a capacitor, and (b) is a circuit diagram illustrating a second form of a capacitor.

Examples of the capacitors C1 and C101 of the embodiments encompass (i) a parallel-plate capacitor, which is shown in (a) of FIG. 22, arranged such that an electrically insulating member is sandwiched between two guide plates facing each other and (ii) a MOS capacitor, which is shown in (b) of FIG. 22, arranged by short-circuiting a drain and a source of an MOS transistor.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a first capacitor having a first end connected to a gate of the first output transistor; an input gate which is supplied with a shift pulse for the each stage and which passes an electric potential to be supplied to the first end of the first capacitor during a pulse period of the shift pulse for the each stage; a first switching element having (i) a first end connected to a second end of the first capacitor, (ii) a second end to which the first direct current voltage is applied, and (iii) a conduction-and-shutoff control terminal that is supplied with a first clock signal which corresponds to the each stage and which has an active clock pulse during a period that does not overlap the pulse period of the shift pulse for the each stage; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the first output terminal of the each stage; and a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the first output terminal of a next stage and (B) in a case where the each stage is the final stage of the successive stage group, a pulse signal that is delayed in phase from a shift pulse outputted from the first output terminal of the final stage, at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with shift pulse for the each stage.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

The fifth switching element achieves the following: When each stage is supplied, from the immediately previous stage, with a voltage at an active level or at a level close to the active level, the fifth switching element is set to the ON state, which causes the second direct current voltage to be applied to the first output terminal of the next stage. This arrangement reliably maintains the first output terminal at a low level while no voltage at the active level is outputted from the first output terminal of the stage.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the fifth switching element, which is connected to (i) the first output terminal of the immediately previous stage and (ii) the first output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a second output transistor having (i) a drain which is supplied with a first clock signal which corresponds to the each stage and which has an active clock pulse during a period that does not overlap a pulse period of a shift pulse for the each stage and (ii) a source serving as a second output terminal which is an output terminal of the each stage and which is different from the first output terminal; a first capacitor having a first end connected to a gate of the first output transistor and to a gate of the second output transistor; an input gate which is supplied with the shift pulse for the each stage and which passes an electric potential to be supplied to the first end of the first capacitor during the pulse period of the shift pulse for the each stage; a first switching element having (i) a first end connected to a second end of the first capacitor, (ii) a second end to which the first direct current voltage is applied, and (iii) a conduction-and-shutoff control terminal which is supplied with the first clock signal; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the second output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the second output terminal of a next stage and (B) in a case where the each stage is the final stage of the successive stage group, a pulse signal that is delayed in phase from a shift pulse outputted from the second output terminal of the final stage; and a sixth switching element having (i) a first end connected to the second output terminal, (ii) a second end to which the second direct current voltage is applied, and (iii) a conduction-and-shutoff control terminal connected to the conduction-and-shutoff control terminal of the fourth switching element, at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with the shift pulse for the each stage.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

Further, it is possible to prevent the potential of one end of the first capacitor from rising due to capacitive coupling, and thus prevent an output from the second output terminal from rising during an unnecessary period, thereby preventing the shift register from malfunctioning. In addition, it is possible to reduce the number of required input signals externally supplied to the shift register.

Further, since the second output transistor is used for outputting a shift pulse transmitted from one stage to another, the second output transistor can be greatly downsized as compared to the first output transistor used for supplying a signal to the outside of the shift register. Consequently, the drain parasitic capacitor of the second output transistor is sufficiently smaller than (i) the drain parasitic capacitor and the source parasitic capacitor of the first output transistor and (ii) the first capacitor. Therefore, even when the first clock signal is supplied to the drain of the second output transistor, it is possible to reduce, to an ignorable level, the influence of a rise in the potential of one end of the first capacitor due to capacitive coupling.

Further, a load caused by driving the second output terminal is sufficiently smaller than a load caused by driving the first output terminal. Therefore, the amount of a variation in the load on an external level shifter that generates a control signal for the shift register can be reduced to an ignorable level.

The fifth switching element achieves the following: When each stage is supplied, from the immediately previous stage, with a voltage at an active level or at a level close to the active level, the fifth switching element is set to the ON state, which causes the second direct current voltage to be applied to the second output terminal of the next stage. This arrangement reliably maintains the first output terminal at a low level while no voltage at the active level is outputted from the second output terminal of the stage.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the fifth switching element, which is connected to (i) the second output terminal of the immediately previous stage and (ii) the second output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a first capacitor having a first end connected to a gate of the first output transistor; an input gate which is supplied with a shift pulse for the each stage and which passes an electric potential to be supplied to the first end of the first capacitor during a pulse period of the shift pulse for the each stage; a first switching element having (i) a first end connected to a second end of the first capacitor, (ii) a second end to which the first direct current voltage is applied, and (iii) a conduction-and-shutoff control terminal that is supplied with a first clock signal which corresponds to the each stage and which has an active clock pulse during a period that does not overlap the pulse period of the shift pulse for the each stage; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the first output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the first output terminal of a next stage and (B) in a case where the each stage is the final stage of the successive stage group, a pulse signal that is delayed in phase from a shift pulse outputted from the first output terminal of the final stage; and a seventh switching element having a first end which is supplied with the shift pulse for the each stage, (ii) a second end to which the second direct current voltage is applied, and (iii) a conduction-and-shutoff control terminal connected to the conduction-and-shutoff control terminal of the fourth switching element.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

The seventh switching element achieves the following: When a signal supplied to the conduction-and-shutoff control terminal of the fourth switching element is set at an active level, the seventh switching element is set to the ON state, which causes the second direct current voltage to be applied to the first output terminal of the immediately previous stage. This arrangement prevents the first capacitor from (i) being unnecessarily charged due to a leak current via the input gate after the first end of the first capacitor of the stage is reset, and from (ii) being subjected to an unnecessary potential rise, which causes an interference, through an unnecessary electric charge of the first capacitor when the first switching element is set to the ON state.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the seventh switching element, which is connected to (i) the first output terminal of the immediately previous stage and (ii) the first output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, a shift register of the present invention includes: one or more cascade connection circuits in each of which stages are cascade-connected to one another for transmission of a shift pulse, at least one of the one or more cascade connection circuits including, among all the stages thereof, a successive stage group constituted by successive stages, each stage of the successive stage group including: a first output transistor having (i) a drain to which a first direct current voltage is applied and (ii) a source serving as a first output terminal which is an output terminal of the each stage; a second output transistor having (i) a drain which is supplied with a first clock signal which corresponds to the each stage and which has an active clock pulse during a period that does not overlap a pulse period of a shift pulse for the each stage and (ii) a source serving as a second output terminal which is an output terminal of the each stage and which is different from the first output terminal; a first capacitor having a first end connected to a gate of the first output transistor and to a gate of the second output transistor; an input gate which is supplied with the shift pulse for the each stage and which passes an electric potential to be supplied to the first end of the first capacitor during the pulse period of the shift pulse for the each stage; a first switching element having (i) a first end connected to a second end of the first capacitor, (ii) a second end to which the first direct current voltage is applied, and (iii) a conduction-and-shutoff control terminal which is supplied with the first clock signal; a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for the each stage; a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the second output terminal of the each stage; a fourth switching element having (i) a first end connected to the first output terminal, (ii) a second end to which the second direct current voltage is applied, and (iii) a conduction-and-shutoff control terminal which is supplied with (A) in a case where the each stage is not a final stage of the successive stage group, a shift pulse outputted from the second output terminal of a next stage and (B) in a case where the each stage is the final stage of the successive stage group, a pulse signal that is delayed in phase from a shift pulse outputted from the second output terminal of the final stage; a sixth switching element having (i) a first end connected to the second output terminal, (ii) a second end to which the second direct current voltage is applied, and (iii) a conduction-and-shutoff control terminal connected to the conduction-and-shutoff control terminal of the fourth switching element; and a seventh switching element having a first end which is supplied with the shift pulse for the each stage, (ii) a second end to which the second direct current voltage is applied, and (iii) a conduction-and-shutoff control terminal connected to the conduction-and-shutoff control terminal of the fourth switching element.

With the above arrangement, the first direct voltage is applied to the drain of the first output transistor, and the switched capacitor operation using the first switching element, the second switching element, and the first capacitor are carried out. This makes it possible to avoid a feed-through phenomenon caused through the drain parasitic capacitor and the source parasitic capacitor of the first output transistor. Consequently, it is possible to prevent (i) a variation in output voltage when a clock signal is supplied to the drain of the first output transistor and (ii) leakage of a potential from a picture element electrode which leakage is caused by the variation in output voltage. Therefore, it is unnecessary to provide an additional circuit for frequently connecting the first output terminal of the stage to a low power source.

The above arrangement thus makes it possible to provide a shift register capable of satisfactorily preventing noises of individual stage outputs without increasing circuit complexity.

Further, it is possible to prevent the potential of one end of the first capacitor from rising due to capacitive coupling, and thus prevent an output from the second output terminal from rising during an unnecessary period, thereby preventing the shift register from malfunctioning. In addition, it is possible to reduce the number of required input signals externally supplied to the shift register.

Further, since the second output transistor is used for outputting a shift pulse transmitted from one stage to another, the second output transistor can be greatly downsized as compared to the first output transistor used for supplying a signal to the outside of the shift register. Consequently, the drain parasitic capacitor of the second output transistor is sufficiently smaller than (i) the drain parasitic capacitor and the source parasitic capacitor of the first output transistor and (ii) the first capacitor. Therefore, even when the first clock signal is supplied to the drain of the second output transistor, it is possible to reduce, to an ignorable level, the influence of a rise in the potential of one end of the first capacitor due to capacitive coupling.

Further, a load caused by driving the second output terminal is sufficiently smaller than a load caused by driving the first output terminal. Therefore, the amount of a variation in the load on an external level shifter that generates a control signal for the shift register can be reduced to an ignorable level.

The seventh switching element achieves the following: When a signal supplied to the conduction-and-shutoff control terminal of each of the fourth and sixth switching elements is set at an active level, the seventh switching element is set to the ON state, which causes the second direct current voltage to be applied to the second output terminal of the immediately previous stage. This arrangement prevents the first capacitor from (i) being unnecessarily charged due to a leak current via the input gate after the first end of the first capacitor of the stage is reset, and from (ii) being subjected to an unnecessary unnecessary electric charge of the first capacitor when the first switching element is set to the ON state.

As a result, each stage Xi of the shift register is less likely to be subjected to a signal interference by a previous stage or later stage even in (i) a high-temperature state involving a large leak current or (ii) an initial state of production, in both of which a current is likely to flow through each transistor. The above arrangement thus prevents an unnecessary output from being transmitted to a later stage. Further, in the case where the seventh switching element, which is connected to (i) the second output terminal of the immediately previous stage and (ii) the second output terminal of the next stage, is provided on the stage between the above two stages, it is advantageously possible to create an efficient circuit pattern layout that minimizes an increase in area and a delay caused by a parasitic component of wiring.

Further, the application of a direct current voltage to the drain of the first output transistor makes it possible to drive the gate bus lines with use of a direct power source. This arrangement advantageously greatly reduces, as compared to the case in which gate bus lines are driven with use of a clock signal by supplying a clock signal to the drain of the first output transistor, load on an external level shifter that generates a control signal for the shift register.

The application of a direct current voltage to the drain of the first output transistor increases a period during which a negative bias is applied between the gate and drain of the first output transistor. This arrangement advantageously reduces an increase in a threshold voltage, and thus prevents degradation in performance of the shift register.

In order to solve the above problems, the shift register of the present invention may be arranged such that the first clock signal supplied to an odd-numbered stage of the successive stage group is opposite in phase to the first clock signal supplied to an even-numbered stage of the successive stage group; and a shift pulse for a first stage of the successive stage group is shifted in phase by half a cycle from the first clock signal supplied to the odd-numbered stage.

The above arrangement advantageously easily allows the shift register to operate normally.

In order to solve the above problems, the shift register of the present invention may be arranged such that the input gate is an eighth switching element having (i) a first end to which the first direct current voltage is applied, (ii) a second end connected to the first end of the first capacitor, and (iii) a conduction-and-shutoff control terminal which is supplied with the shift pulse for the each stage.

The above arrangement causes the shift pulse for the stage to be supplied to the conduction-and-shutoff control terminal of the eighth switching element, and thus allows for constant reduction in a leak current flowing to the first end of the first capacitor via the input gate. This advantageously increases the effect of preventing an unnecessary output from being transmitted to a later stage.

In order to solve the above problems, the shift register of the present invention may be arranged such that the first output transistor, the first switching element, the second switching element, the third switching element, the fourth switching element, and the fifth switching element are each a thin film transistor.

The above arrangement particularly includes, as a switching element, a TFT, which has a large leak current because it needs to be extremely large in size to compensate for a large ON resistance. This increases the benefit gained by preventing an unnecessary output, arising from a leak current, from being transmitted to a later stage. There is a need to deal with a leakage because there is a large variation in TFT properties, and thus a leak current likely varies greatly between TFTs in an identical circuit. In this respect as well, the above arrangement increases the benefit gained by preventing an unnecessary output, arising from a leak current, from being transmitted to a later stage.

In order to solve the above problems, the shift register of the present invention may be arranged such that the first output transistor, the first switching element, the second switching element, the third switching element, the fourth switching element, the fifth switching element, and the sixth switching element are each a thin film transistor.

The above arrangement particularly includes, as a switching element, a TFT, which has a large leak current because it needs to be extremely large in size to compensate for a large ON resistance. This increases the benefit gained by preventing an unnecessary output, arising from a leak current, from being transmitted to a later stage. There is a need to deal with a leakage because there is a large variation in TFT properties, and thus a leak current likely varies greatly between TFTs in an identical circuit. In this respect as well, the above arrangement increases the benefit gained by preventing an unnecessary output, arising from a leak current, from being transmitted to a later stage.

In order to solve the above problems, the shift register of the present invention may be arranged such that the first output transistor, the first switching element, the second switching element, the third switching element, the fourth switching element, and the seventh switching element are each a thin film transistor.

The above arrangement particularly includes, as a switching element, a TFT, which has a large leak current because it needs to be extremely large in size to compensate for a large ON resistance. This increases the benefit gained by preventing an unnecessary output, arising from a leak current, from being transmitted to a later stage. There is a need to deal with a leakage because there is a large variation in TFT properties, and thus a leak current likely varies greatly between TFTs in an identical circuit. In this respect as well, the above arrangement increases the benefit gained by preventing an unnecessary output, arising from a leak current, from being transmitted to a later stage.

In order to solve the above problems, the shift register of the present invention may be arranged such that the first output transistor, the second output transistor, the first switching element, the second switching element, the third switching element, the fourth switching element, the sixth switching element, and the seventh switching element are each a thin film transistor.

The above arrangement particularly includes, as a switching element, a TFT, which has a large leak current because it needs to be extremely large in size to compensate for a large ON resistance. This increases the benefit gained by preventing an unnecessary output, arising from a leak current, from being transmitted to a later stage. There is a need to deal with a leakage because there is a large variation in TFT properties, and thus a leak current likely varies greatly between TFTs in an identical circuit. In this respect as well, the above arrangement increases the benefit gained by preventing an unnecessary output, arising from a leak current, from being transmitted to a later stage.

In order to solve the above problems, the shift register of the present invention may be arranged such that the eighth switching element is a thin film transistor.

The above arrangement particularly includes, as a switching element, a TFT, which has a large leak current because it needs to be extremely large in size to compensate for a large ON resistance. This increases the benefit gained by preventing an unnecessary output, arising from a leak current, from being transmitted to a later stage. There is a need to deal with a leakage because there is a large variation in TFT properties, and thus a leak current likely varies greatly between TFTs in an identical circuit. In this respect as well, the above arrangement increases the benefit gained by preventing an unnecessary output, arising from a leak current, from being transmitted to a later stage.

In order to solve the above problems, a display device of the present invention includes: the shift register.

The above arrangement thus makes it possible to provide a display device capable of satisfactorily preventing noises of individual stage outputs without increasing circuit complexity.

The present invention is not limited to the description of the embodiments above, but may be altered by a skilled person within the scope of the claims. Any embodiment based on a proper combination of technical means disclosed in different embodiments is encompassed in the technical scope of the present invention.

INDUSTRIAL APPLICABILITY

The present invention is suitably applicable to an active matrix display device.

REFERENCE SIGNS LIST

C1 capacitor (first capacitor)
M1 transistor (input gate; eighth switching element)
M2 transistor (first switching element)
M3 transistor (second switching element)
M4 transistor (third switching element)
M5 transistor (first output transistor)
M6 transistor (fourth switching element)
M7 transistor (second output transistor)
M8 transistor (sixth switching element)
M10 transistor (fifth switching element)
M11 transistor (seventh switching element)
OUT terminal (an output terminal; first output terminal)
Z terminal (an output terminal; second output terminal)
VDD power source voltage (first direct current voltage)
VSS power source voltage (second direct current voltage)
Xi stage
CLK1 clock signal (first clock signal for an odd-numbered stage)
CLK2 clock signal (first clock signal for an even-numbered stage)

The invention claimed is:

1. A shift register comprising:
one or more cascade connection circuits in each of which stages are cascade-connected to one another for transmission of a shift pulse,
at least one of said one or more cascade connection circuits including, among all the stages thereof, a successive stage group constituted by successive stages,
each stage of the successive stage group including:
a first output transistor having (i) a drain to which a first direct current voltage is applied and (ii) a source serving as a first output terminal which is an output terminal of said each stage;
a second output transistor having (i) a drain which is supplied with a first clock signal which corresponds to said each stage and which has an active clock pulse during a period that does not overlap a pulse period of a shift pulse for said each stage and (ii) a source serving as a second output terminal which is an output terminal of said each stage and which is different from the first output terminal;
a first capacitor having a first end connected to a gate of the first output transistor and to a gate of the second output transistor;
an input gate which is supplied with the shift pulse for said each stage and which passes the first direct current voltage to be supplied to the first end of the first capacitor during the pulse period of the shift pulse for said each stage;
a first switching element having (i) a first end connected to a second end of the first capacitor, (ii) a second end to which the first direct current voltage is applied, and (iii) a conduction-and-shutoff control terminal which is supplied with the first clock signal;
a second switching element having (i) a first end connected to the second end of the first capacitor, (ii) a second end to which a second direct current voltage lower than the first direct current voltage is applied, and (iii) a conduction-and-shutoff control terminal which is supplied with the shift pulse for said each stage;
a third switching element having (i) a first end connected to the first end of the first capacitor, (ii) a second end to which the second direct current voltage is applied, and (iii) a conduction-and-shutoff control terminal which is supplied with a pulse signal that is delayed in phase from a shift pulse outputted from the second output terminal of said each stage;
a fourth switching element having (i) a first end connected to the first output terminal, (ii) a second end to which the second direct current voltage is applied, and (iii) a conduction-and-shutoff control terminal which is supplied with (A) in a case where said each stage is not a final stage of the successive stage group, a shift pulse outputted from the second output terminal of a next stage and (B) in a case where said each stage is the final stage of the successive stage group, a pulse signal that is delayed in phase from a shift pulse outputted from the second output terminal of the final stage; and
a sixth switching element having (i) a first end connected to the second output terminal, (ii) a second end to which the second direct current voltage is applied, and (iii) a conduction-and-shutoff control terminal connected to the conduction-and-shutoff control terminal of the fourth switching element,
at least each stage other than the final stage in the successive stage group including a fifth switching element having (i) a first end connected to the conduction-and-shutoff control terminal of the fourth switching element, (ii) a second end to which the second direct current voltage is applied, and (iii) a conduction-and-shutoff control terminal which is supplied with the shift pulse for said each stage.

2. The shift register according to claim 1, wherein:
the first output transistor, the second output transistor, the first switching element, the second switching element, the third switching element, the fourth switching element, the fifth switching element, and the sixth switching element are each a thin film transistor.

* * * * *